(12) United States Patent
Kannengiesser et al.

(10) Patent No.: US 11,874,355 B2
(45) Date of Patent: Jan. 16, 2024

(54) MAGNETIC RESONANCE FINGERPRINTING METHOD

(71) Applicant: Siemens Healthcare GmbH, Erlangen (DE)

(72) Inventors: Stephan Kannengiesser, Wuppertal (DE); Thomas Kluge, Hirschaid (DE); Gregor Körzdörfer, Erlangen (DE); Mathias Nittka, Baiersdorf (DE); Josef Pfeuffer, Kunreuth (DE); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/610,374

(22) PCT Filed: May 6, 2020

(86) PCT No.: PCT/EP2020/062506
§ 371 (c)(1),
(2) Date: Nov. 10, 2021

(87) PCT Pub. No.: WO2020/229243
PCT Pub. Date: Nov. 19, 2020

(65) Prior Publication Data
US 2022/0229136 A1 Jul. 21, 2022

(30) Foreign Application Priority Data

May 10, 2019 (DE) .......................... 102019206827.8

(51) Int. Cl.
*G01R 33/50* (2006.01)
*G01R 33/48* (2006.01)
(Continued)

(52) U.S. Cl.
CPC ......... *G01R 33/50* (2013.01); *G01R 33/4806* (2013.01); *G01R 33/4818* (2013.01);
(Continued)

(58) Field of Classification Search
CPC ............ G01R 33/4806; G01R 33/4818; G01R 33/50; G01R 33/5608; G01R 33/5618; G01R 33/56581
See application file for complete search history.

(56) References Cited

U.S. PATENT DOCUMENTS

2002/0151785 A1 10/2002 Mueller et al.
2014/0028313 A1 1/2014 Paul
(Continued)

FOREIGN PATENT DOCUMENTS

CN 1386475 A 12/2002
CN 103576114 A 2/2014
(Continued)

OTHER PUBLICATIONS

Bhavsar, Payal S., et al. "Fast, Variable System Delay Correction for Spiral MRI." Magnetic Resonance in Medicine, vol. 71, No. 2, 2013, pp. 773-782., https://doi.org/10.1002/mrm.24730. Obtained Feb. 11, 2023 (Year: 2013).*
(Continued)

*Primary Examiner* — Gregory H Curran
(74) *Attorney, Agent, or Firm* — Banner & Witcoff Ltd.

(57) ABSTRACT

Determining parameter values in image points of an examination object in an MR system by an MRF technique. Comparison signal waveforms, established using predetermined recording parameters, and each assigned to predetermined values of the parameters to be determined, are loaded. An image point time series of the examination object is acquired with an MRF recording method such that the acquired image point time series are comparable with the
(Continued)

loaded comparison signal waveforms. A signal comparison of a section of the respective signal waveform of the acquired one image point time series is carried out with a corresponding section of loaded comparison signal waveforms to establish similarity values. The values of the parameters to be determined on the basis of the most similar comparison signal waveforms determined are determined, and then stored or output.

43 Claims, 5 Drawing Sheets

(51) Int. Cl.
    *G01R 33/56*     (2006.01)
    *G01R 33/561*     (2006.01)
    *G01R 33/565*     (2006.01)

(52) U.S. Cl.
    CPC ..... *G01R 33/5608* (2013.01); *G01R 33/5618* (2013.01); *G01R 33/56581* (2013.01)

(56) References Cited

U.S. PATENT DOCUMENTS

| | | | |
|---|---|---|---|
| 2014/0167754 A1 | 6/2014 | Jerecic et al. | |
| 2016/0103196 A1* | 4/2016 | Grodzki | G01R 33/56572 324/309 |
| 2018/0074145 A1 | 3/2018 | Kluge et al. | |
| 2018/0106876 A1 | 4/2018 | Nielsen et al. | |
| 2019/0033413 A1 | 1/2019 | Amthor et al. | |

FOREIGN PATENT DOCUMENTS

| | | |
|---|---|---|
| CN | 104854446 A | 8/2015 |
| CN | 107533121 A | 1/2018 |
| CN | 108375747 A | 8/2018 |
| CN | 108603921 A | 9/2018 |

OTHER PUBLICATIONS

Cheng, H.-L et al.: "Practical Medical Applications of Quantitative MR Relaxometry", in: Journal of Magnetic Resonance Imaging, vol. 36, pp. 805-824 (2012).
Bipin Mehta, Bhairav et al:, "Magnetic resonance fingerprinting: a technical review", Magnetic Resonance in Medicine., vol. 81, No. 1, pp. 25-46, XP055562942, US ISSN: 0740-3194, DOI: 10.1002/mrm.27403; 2018.
Meyer; C. H. et al.: "Dual-Density and Parallel Spiral ASL for Motion Artifact Reduction", in: Proc. Intl. Soc. Mag. Reson. Med.,. vol. 19 (2011), p. 3986.
Tan H. et al.: "Estimation of k-Space Trajectories in Spiral MRI", in: Magnetic Resonance in Medicine, 2009, vol. 61, pp. 1396-1404; 2009.
McGivney, Debra F. et al. "SVD Compression for Magnetic Resonance Fingerprinting in the Time Domain" IEEE Transactions on Medical Imaging, vol. 33, No. 12, Dec. 2014 // DOI: 10.1109/TMI.2014.2337321.
Warntjes, J.B.M. et al.:"Novel method for rapid, simultaneous T1, T*2, and proton density quantification"; in: Magnetic Resonance in Medicine; vol. 57; No. 3; pp. 528-537; 2007; DOI: https://doi.org/10.1002/mrm.21165.
Pfeuffer, J. et. al.: "Mitigation of Spiral Undersampling Artifacts in Magnetic Resonance Fingerprinting (MRF) by Adapted Interleave Reordering", in: Proc. Intl. Soc. Mag. Reson. Med. 25 (2017), Proceedings ISMRM 2017.

"Meet Phannie, NIST's Standard 'Phantom' for Calibrating MRI Machines"; Internet Article on www.nist.gov; May 11, 2010; https://www.nist.gov/news-events/news/2010/05/meet-phannie-nists-standard-phantom-calibrating-mri-machines.
Körzdörfer, Gregor at al: "Effect of spiral undersampling patterns on FISP MRF parameter maps", Magnetic Resonance Imaging, Elsevier Science, vol. 62, pp. 174-180, XP085758389, ISSN: 0730-725X, DOI: 10.1016/J.MRI.2019.01.011; 2019.
Cauley S.F. et al.: "Fast Group Matching for MR Fingerprinting Reconstruction"; In: Magn. Reson.Med. 74; pp. 523-528; 2015.
Lattanzi, Riccardo et al: "Phase unwinding for dictionary compression with multiple channel transmission in magnetic resonance fingerprinting", Magnetic Resonance Imaging, vol. 49, pp. 32-38, XP055518025, ISSN: 0730-725X, DOI: 10.1016/j.mri.2017.12.015; 2017.
Chung, Sohae et al.: "Rapid B1+ Mapping Using a Preconditioning rF Pulse with TurboFLASH Readout"; in: Magnetic Resonance in Medicine; vol. 64; pp. 439-446; 2010.
Chen, Yong et al.: "MR Fingerprinting for Rapid Quantitative Abdominal Imaging"; in: Radiology; vol. 279; No. 1; pp. 278-286; 2016; DOI: https://doi.org/10.1148/radiol.2016152037.
Ma, Dan et al.: "Magnetic Resonance Fingerprinting"; in: Nature; Mar. 14, 2013; vol. 495; No. 7440; pp. 187-192; DOI:10.1038/nature11971.
"Quantitative MRI (qMRI) System Phantom"; http://www.hpd-online.com/system-phantom.php; Screenshot from web.archive.org; taken on Apr. 16, 2018; https://web.archive.org/web/20180416213238/http://hpd-online.com:80/system- phantom.php.
Körzdörfer, Gregor et al: "Magnetic resonance field fingerprinting", Magnetic Resonance in Medicine, XP055516998, US ISSN: 0740-3194, DOI: 10.1002/mrm.27558; 2018.
Kaggie, Joshua et al.: "Magnetic Resonance Fingerprinting of the Normal Pancreas", Proceedings of the International Society for Magnetic Resonance in Medicine, 27th Annual Meeting and Exhibition, No. 644, XP040708031; 2019.
Muja, Marius et al. "Fast Approximate Nearest Neighbors With Automatic Algorithm Configuration" VISAPP International Conference on Computer Vision Theory and Applications, 2009.
Cline, Christopher C. et al.: "AIR-MRF: Accelerated iterative reconstruction for magnetic resonance fingerprinting"; in: Magnetic Resonance Imaging; vol. 41; pp. 29-40; 2017.
Jiang, Yun et al. "MR Fingerprinting Using Fast Imaging with Steady State Precession (FISP) with Spiral Readout" Magnetic Resonance in Medicine, vol. 74, pp. 1621-1631, 2015 // DOI: 10.1002/mrm.25559.
Hoppe, Elisabeth et al.: "Deep Learning for Magnetic Resonance Fingerprinting: A New Approach for Predicting Quantitative Parameter Values from Time Series"; in: Studies in Health Technology and Informatics; vol. 243; pp. 202-206; 2017; DOI: 10.3233/978-1-61499-808-2-202.
Körzdörfer, Gregor et al.: "Description of the off-resonance dependency in slice-selective FISP MRF", Proceedings of the International Society for Magnetic Resonance in Medicine, 24th Annual Meeting and Exhibition, No. 4232, XP040703440,; 2018.
Zhao, Bo et al: "Optimal Experiment Design for Magnetic Resonance Fingerprinting: Cramer-Rao Bound Meets Spin Dynamics", arxiv.org, Cornell University Library, XP081419661, DOI: 10.1109/TMI.2018.2873704; 2017.
Huan; Min et al.; "Fast Group Matching Method Based on Singular Value Decomposition Decomposition for Magnetic Resonance Fingerprinting", Journal of Biomedical Engineering Research; Bd. 36; Nr. 2; pp. 112-115, 120; DOI: 10.19529/j.cnki.1672-6278.2017.02.04.

\* cited by examiner

MAGNETIC RESONANCE FINGERPRINTING METHOD

FIELD OF THE DISCLOSURE

The disclosure relates to a magnetic resonance fingerprinting method for improved determination of local parameter values of an examination object.

BACKGROUND OF THE DISCLOSURE

Magnetic resonance (MR) is a known technique with which images of the inside of an examination object can be created. Expressed in simple terms, the examination object is positioned for this purpose in a magnetic resonance device in a comparatively strong static, homogeneous magnetic field, also called a B0 field, with field strengths from 0.2 tesla to 7 tesla and more, so that said object orients its nuclear spins along the basic magnetic field. To trigger nuclear spin resonances radio-frequency excitation pulses (RF pulses) are radiated into the examination object, the nuclear spin resonances triggered are measured as so-called k-space data and MR images are reconstructed on the basis thereof or spectroscopy data is determined. For spatial encoding of the measurement data, rapidly switched magnetic gradient fields are superimposed on the basic magnetic field, which define the trajectories along which the measurement data in the k-space is read out. The recorded measurement data is digitized and stored as complex numerical values in a k-space matrix. From the k-space matrix occupied by the values an associated MR image is able to be reconstructed, by means of a multidimensional Fourier transformation for example. A series of RF pulses to be radiated in in a specific manner used for this purpose, gradients to be switched and readout processes are referred to as a sequence. The gradient fields switched in the three possible gradient directions for example (with amplitudes not equal to zero), especially for spatial encoding or signal manipulation, are referred to as gradients for short.

Various types of sequence are known, which differ in their sensitivity to the parameters describing the substances contained in an object being examined (e.g. the longitudinal relaxation T1, the transversal relaxation T2 and the proton densities). The MR images reconstructed from measurement data recorded with a specific sequence type show weighted images of the examination object corresponding to the sensitivities of the sequence type used.

A magnetic resonance imaging by means of a magnetic resonance system can serve to determine a presence and/or a distribution of a substance that is located in the examination object. The substance in this case can be a, possibly pathological, tissue of the examination object, a contrast medium, a marking substance or a metabolism product.

Information about the substances present can be obtained from the measurement data in a variety of ways in such cases. A relatively simple source of information is image data reconstructed from the measurement data for example. There are however more complex methods which establish information about the object being examined from image point time series of image data reconstructed from successively measured measurement datasets.

With the aid of quantitative MR imaging techniques, absolute characteristics of the measured object can be determined, e.g. the tissue-specific T1 and T2 relaxation on a human being. By contrast the conventional sequences mostly used in clinical routine merely create a relative signal intensity of different tissue types (so-called weightings), so that the diagnostic interpretation is to a great extent based on the subjective estimation of the radiologist. Quantitative techniques thus offer the obvious advantage of an objective comparability, but, as a result of long measurement times, are scarcely used currently during routine procedures.

Newer quantitative measurement methods such as e.g. fingerprinting methods (MRF methods) could reduce the disadvantage of the long measurement times to an acceptable extent. With MRF methods measurement data is recorded consecutively with different recording parameters. From the measurement data recorded consecutively a series of image data is reconstructed. A signal waveform of one of the pixels of the sequence of image data in each case is regarded as a pixel time series. Here the signal waveform can be investigated for all image data or at least for pixels of interest of the image data. Such a signal waveform of an image point time series is often referred to here as a fingerprint of the location of the examination object shown in the respective pixel. A signal waveform of this type can be used to determine parameters present in the location shown by the image point.

To this end these signal waveforms are compared by means of pattern recognition with signal waveforms of a previously established database of signal waveforms characteristic for specific substances (the so-called dictionary). Thus the substances represented in the image data reconstructed from the measurement data or the spatial distribution of tissue-specific parameters (such as e.g. the transversal relaxation T2, the effective transversal relaxation T2* or the longitudinal relaxation T1; so-called T2, T2* and T1 maps) can be established in the imaged examination object. The signal waveforms contained in a dictionary of this type can be measured signal waveforms here of which the parameter values are known, or they can have been created by simulations.

The principle of this method is thus to compare signal waveforms measured on an examination object with a large number of known signal waveforms measured beforehand. In such cases signal waveforms for different combinations of T1 and T2 relaxation times and also other parameters can have been established for the dictionary. This is called a dimension of the dictionary for each parameter to be determined in which different parameter values of the respective parameter are included, in order to make available various comparison values. The parameter values, e.g. T1 and T2 times of an image point (pixels/voxels) in the image are then in particular determined by the measured signal waveform being compared with all or with a part of the simulated signal waveforms. This process is referred to as "matching". That signal waveform of the dictionary which is closest to the measured signal waveform determines in known MRF methods the values of the parameters, e.g. relaxation parameters T1 and T2, of the respective image point. Such a determination of the parameter values is also referred to in connection with MRF techniques as a reconstruction or reconstruction process.

Basically any echo technique (in particular spin echo (SE) techniques and gradient echo (GRE) techniques) in combination with any given method for k-space sampling (e.g. Cartesian, spiral, radial) can be used for MRF methods.

An MRF method that takes account of the tissue-specific parameters T1 and T2 in the dictionary used and determines them in image point time series is described for example in the article by Ma et al., "Magnetic Resonance Fingerprinting", Nature, 495: pp. 187-192 (2013). In said article a TrueFISP ("true fast imaging with steady-state free precession")-based sequence is used in combination with a spiral k-space sampling.

Another MRF implementation is described by Jiang et al. in the article entitled "MR Fingerprinting Using Fast Imaging with Steady State Precession (FISP) with Spiral Readout", Magnetic Resonance in Medicine 74: pp. 1621-1631, 2015. In this article an FISP sequence "Fast Imaging with Steady State Precession" is used in combination with a spiral sampling: After an adiabatic 180° RF inversion pulse for explicit disruption of the steady state of the spin, a series of RF excitation pulses with pseudo randomized flip angles is applied, and each echo resulting after an RF excitation pulse in each case is read out with an individual spiral k-space trajectory. n RF excitation pulses are used which likewise create many echoes. An individual image is reconstructed from the measurement data recorded along the respective spiral k-space trajectory. A signal waveform for each image point is extracted from the n individual images, which is compared with the simulated signal waveforms. The time interval TR between two consecutive RF excitation pulses of the n RF excitation pulses can likewise be varied here, e.g. in a pseudo randomized manner.

Further MRF methods are likewise described for example in the article by Cauley S et al. "Fast group matching for MR fingerprinting reconstruction", Magnetic Resonance in Medicine 74:523-528 (2015), and in the article by Cline C et al. "AIR-MRF: Accelerated iterative reconstruction for magnetic fingerprinting", Magnetic Resonance Imaging 41:29-40, 2017, which additionally determines the parameter values by means of a signal comparison carried out iteratively.

SUMMARY

The underlying object of the disclosure is to improve known MRF methods.

An object is achieved by a method for determining parameter values in image points of an examination object by means of a magnetic resonance fingerprinting (MRF) technique, by a magnetic resonance system, by a computer program, and also by an electronically readable data medium.

A disclosed method for determination of parameter values (P) in image points of an examination volume of an examination object in an MR system by means of a magnetic resonance fingerprinting (MRF) technique comprises the following steps:

Loading a number N of comparison signal waveforms (D) that are each assigned to predetermined values of the parameters to be determined, wherein the comparison signal waveforms (D) are comparison signal waveforms (D) established using predetermined recording parameters and wherein the recording parameters comprise a number of signal measurements SM, recording parameters, which characterize RF pulses to be used for a respective signal measurement, and repetition times, which specify the respective time interval between excitations of consecutive signal measurements SM, Acquisition of at least one image point time series (BZS) of the examination object with the aid of an MRF recording method in such a way that acquired image point time series (BZS) are able to be compared with the loaded comparison signal waveforms, Carrying out of a signal comparison between at least one section of the respective signal waveform of the acquired image point time series (BZS) and a corresponding section of loaded comparison signal waveforms (D) to establish similarity values (V) of the acquired image point time series (BZS) and the respective comparison signal waveforms (D), Determination of the values (P) of the parameters to be determined on the basis of the n most similar comparison signal waveforms determined, wherein n is a predetermined natural number, and Storage and/or output of the values (P) determined for the respective image point of the parameters to be determined.

By means of the signal comparison carried out the method allows a determination of the values of parameters present in the examination object in a far shorter time than methods that attempt to determine parameter values by fitting measurement data to signal models.

A disclosed magnetic resonance system comprises a magnetic unit, a radio-frequency unit and a control facility embodied to carry out a disclosed method with a parameter determination unit.

A disclosed computer program implements a disclosed method on a control facility when it is executed on the control facility.

The computer program can also be present here in the form of a computer program product, which is able to be loaded into a memory of a control facility, with program code means for carrying out a disclosed method when the computer program product is executed in the processing unit of the computer system.

A disclosed electronically readable data medium comprises electronically readable control information stored on said medium, which comprises at least one computer program and is designed in such a way that, when the data medium is used in a control facility of a magnetic resonance system, it carries out a disclosed method.

The advantages and remarks specified with regard to the method also apply by analogy to the magnetic resonance system and to the electronically readable data medium.

BRIEF DESCRIPTION OF THE DRAWINGS

Further advantages and details of the present disclosure emerge from the exemplary embodiments described below as well as with reference to the drawings. The examples given do not represent any restriction on the disclosure. In the figures.

DETAILED DESCRIPTION

Figure 1:
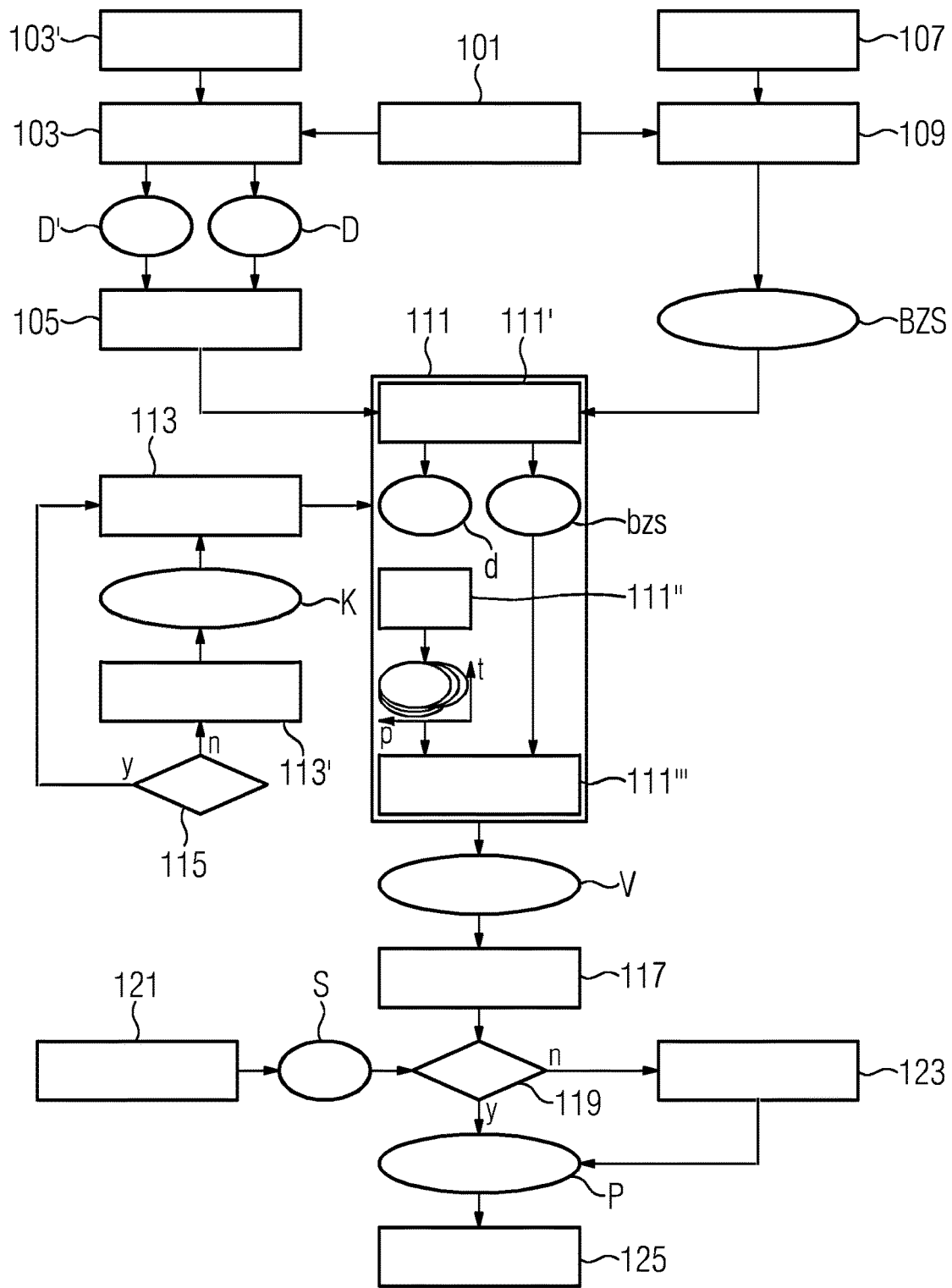
FIG. 1 shows a schematic flow diagram of a disclosed method.

FIG. 1 is a schematic flow diagram of a disclosed MRF method.

Recording parameters are predetermined (block 101) for the MRF method that, together with the parameters to be determined, characterize a signal waveform.

A signal recorded by means of MR technology depends on the recording parameters used during the measurement of the signal, for example on the RF pulses used during the measurement, which e.g. can be characterized via their flip angle, and on the repetition times TR used during the measurement, i.e. in particular on the time intervals between two excitations of the spins in the examination object in consecutive signal measurements SM. A further recording parameter, which has an influence on a signal recorded by means of MR technology, is the echo time TE for example, which specifies the time interval used between an RF excitation pulse and the subsequent recording of a signal recorded therewith. In this case the echo time TE can specify the period of time between the start of the excitation by an RF excitation pulse and the start of the subsequent recording, or also, especially in the case of echo trains, e.g. the time central echo signal in the sampled k-space. The respective dependencies are known for example from the Bloch equations.

In the MRF method proposed here the recording parameters can be predetermined in such a way that, for a given issue, which is to be examined in the MRF measurement, the optimum possible dependencies of the signal waveforms on the comparison signal waveforms of the parameters expected in the examination object and parameters to be determined are present, wherein at the same time the aim can be an overall measurement time that is as short as possible. As possible criteria for such optimization criteria, criteria are considered in particular that relate to a sensitivity of the signal waveforms obtained to parameters expected in the examination object, so that an at least sufficient sensitivity of the signal waveforms at least to the parameters determined, e.g. with the shortest possible waveforms, can be achieved.

For MRF methods that provide for a whole series of signal measurements SM a further possible recording parameter is the length of the comparison signal waveforms, which is defined by the number of signal measurements provided for the signal waveform to be considered.

Furthermore parameters to be determined and desired parameter values for each parameter to be determined, for which comparison signal waveforms are to be established, are defined (block 103').

On the basis of the predetermined recording parameters and the parameters to be determined and their respective associated parameter values comparison signal waveforms D and/or D' are established (block 103). In the selection of the predetermined recording parameters and/or of the parameters to be determined and/or of their associated parameter values an optimization of this selection (in each case), also with the aid of a neural network or also based on heuristic assumptions for example, can be carried out, which takes account of the magnetic resonance system to be used, the examination object to be examined and/or the issue to be examined for example, and keeps the measurement time needed for the MRF measurement overall as short as possible, and in doing so adheres to a predetermined minimum requirement for the quality of the parameter values determined.

The comparison signal waveforms D and/or D' established can, once they are actually established, be stored in a memory unit for example. Stored comparison signal waveforms D and/or D' can be loaded for a further use (block 105).

The establishment of the comparison signal waveforms D and thus a determination of dictionaries already mentioned, is an important aspect in MRF techniques, which distinguishes these from other quantitative MR methods. As already mentioned the dictionary is frequently created by different possible comparison signal waveforms being pre-computed, e.g. by simulation, in particular on the basis of the Bloch equations. By contrast, in other quantitative methods for determination of parameter values by means of MR measurements, as a rule the measured signals are fitted to a model. A simulation of the comparison signal waveforms D, which are intended to form an MRF dictionary, only has to be carried out once and a new fit does not, as with other quantitative methods, have to be carried out for each measurement. This enables far more complex signal models to be used for a simulation of the comparison signal waveforms D than with other quantitative MR methods and still enables the reconstruction times to be kept short.

With increasing complexity of the simulation of comparison signal waveforms (e.g. with regard to the number of the parameters incorporated and/or with regard to the resolution of the possible values of the parameters) the time that is needed for the simulation of a dictionary increases however. The same applies for the reconstruction, since the time spent in matching, i.e. the signal comparison to be carried out for the determination of the parameter values sought, likewise increases with the number of comparison signal waveforms contained in a dictionary.

All comparison signal waveforms D and/or D', which were established on the basis of the same recording parameters, are assigned to a common dictionary in each case. As already stated, the "length" of the comparison signal waveforms of a dictionary are defined by the recording parameter "number of signal measurements SM" for a comparison signal waveform. The comparison signal waveforms of a dictionary are distinguished from one another in the values of the parameters to be determined assigned to them, wherein precisely one combination of one desired value in each case of each of the parameters to be determined is assigned to a comparison signal waveform, which are used (as well as the said recording parameters) during the establishment of the comparison signal waveform, e.g. by insertion into the Bloch equations, as the basis.

The size of a dictionary, i.e. the number of comparison signal waveforms that are included in a common dictionary, greatly depends on the desired parameters to be determined and on the number of values provided in each case for each of these parameters for which comparison signal waveforms are to be established.

In this instance, in a simple case the size of a dictionary can be predetermined by combination of each value provided of a parameter to be determined with each value provided of all other parameters to be determined. For example if a dictionary were to contain the $n_A$ values of a parameter PA to be determined and $n_B$ values of a parameter PB to be determined and also $n_C$ values of a parameter Pc to be determined, it would reach a size of $N=n_A*n_B*n_c$, when each possible combination with one another of the values possible for each parameter to be determined is to be contained in the dictionary. Thus it is evident that the size of a dictionary rises quickly with the number of different parameters to be determined. However by exclusion, e.g. for physical reasons or based on heuristic experience, of specific parameter values, a reduction of the size of a dictionary can be achieved without the quality of the parameter values determined using this dictionary being reduced.

For such an exclusion an exclusion rule can be set up, in accordance with which its parameter value combinations are assessed, so that, for parameter value combinations that fulfill the exclusion rule, no comparison signal waveform is established. For example in a dictionary that comprises the relaxation times T1 and T2, those combinations of desired values of T1 and T2 will be excluded for which the desired value of T2 is greater than the desired value of T1, when substances are to be examined for which the associated T2 value is always smaller than the associated T1 value, which is the case with human tissue for example.

Thus the size of a dictionary, which comprises comparison signal waveforms for the parameters A, B and C as parameters to be determined, having a size of $n_A * n_B * n_C$, with $n_A$ equal to the number of the desired values for A, $n_B$ equal to the number of desired values for B and $n_C$ equal to the number of desired values for C, e.g. can be reduced to $((n_A * n_B) - n_X) * n_C$, with $n_X$ equal to the number of the excluded pairs of values of the parameters A and B that fulfill a set exclusion rule.

Thus the size of a dictionary, which comprises comparison signal waveforms for the parameters T1, T2 and the RF transmit field B1 (more on this later) as parameters to be determined, having a size of $n_{T1} * n_{T2} * n_{B1}$, with $n_{T1}$ equal to the number of the desired values for T1, $n_{T2}$ equal to the number of desired values for T2 and $n_{B1}$ equal to the number of desired values for B1, e.g. can be reduced to $((n_{T1} * n_{T2}) - n_X) * n_{B1}$, with $n_X$ equal to the number of the excluded pairs of values of T1 and T2, for which the desired T2 value is greater than the desired T1 value.

In order to reduce the size of the dictionary however certain combinations could also be assumed, in particular e.g. when it makes sense physically or from known conditions about the examination object. To this end it can first be established whether for example specific combinations of parameters to be determined can be excluded for a given examination object. This can in particular be done for parameters to be determined for specific tissue, e.g. on the basis of parameter values known from the literature occurring for a respective tissue and/or for combinations of parameter values of different parameters to be determined.

The values of at least one of the parameters to be determined, for which comparison signal waveforms are to be established, lie in an overall value range of this parameter to be determined, i.e. there exists a smallest parameter value and a largest parameter value for the parameter to be determined, which delimit the overall value range of the parameter. The overall value range can in particular be selected as a function of values of the respective parameter to be determined of substances assumed to be in the examination object. In this way taking into account of unnecessary, superfluous parameter values for a given issue, in the establishment of the comparison signal waveforms for example, can be avoided, which would unnecessarily increase the size of the dictionary. The values for a parameter to be determined for which comparison signal waveforms must be established can thus be made dependent on the examination objects to be examined with the dictionary and the underlying issues which are to be resolved by means of the MRF method.

For example for MRF examinations of the brain the values of the parameters to be determined for the comparison signal waveforms of a dictionary in each case can be established in such a way that the parameters to be determined, in particular T1 and T2, comprise the usual parameter values for a brain.

It can be sensible however to select the values chosen for establishing comparison signal waveforms of parameters to be determined in such a way that these comprise values that are larger and/or smaller than the values of the substances assumed to be in the object. In this way the overall value range is expanded in such a way that even deviations from known normal values can still be established. The extent to which such an expansion of the overall value range is sensible depends on the (medical) issue and must be weighed against the enlargement of the dictionary associated therewith.

A selected value range for parameters to be determined can be divided into at least two of value range sections, which comprise values in different resolutions. For example in at least two of the range of value sections a different resolution in each case of the selected values can be chosen, so that in one of the at least two range of value sections the selection is made in a higher resolution than in another of the at least two range of value sections. The resolution selected for a value range section can be predetermined for example by an increment between adjacent values in a value range section. In this way in a value range section there can be a smaller increment (greater resolution) than in at least one other value range section.

In order to guarantee a determination of the parameters to be determined that is as precise as possible, the resolution of the selected values in value range sections especially relevant for an issue to be examined can be chosen to be higher than in other value range sections of the overall value range.

In order to keep the computing time, memory requirement and reconstruction time, in which the parameters to be determined are determined by means of a signal comparison between the comparison signal waveforms and signal waveforms of acquired image point time series, within limits, the resolution of the dictionary overall (i.e. the respective overall value ranges of the parameters to be determined and the intervals of the values selected in each case for the parameters to be determined) can be limited. On the other hand such a limitation and the quantization of the values of the parameters to be determined associated therewith can have been established for the comparison signal waveforms, in which results for the determination of the values of the parameters to be determined are clearly visible and under some circumstances (depending on application area) represent a limiting factor. Therefore a desired resolution and thus precision of the values determined of the parameters to be determined on the one hand (which tend to call for an enlargement of the dictionaries used) and the computing effort and the reconstruction times on the other hand have to be carefully weighed against one another.

In order to keep the reconstruction time, the memory requirement and the computing time of the comparison signal waveforms low, a value range section, for which a resolution was selected that exceeds a predetermined resolution threshold value, can be restricted to an area of the value range section that is as small as possible, in order to steer the number of selected values back within predetermined limits by the restriction of the value range section. In other words: At least one value range section of the overall value range with a resolution that is greater than a threshold value can be kept as small as possible, e.g. by a limitation of the extent of the value range section.

In an example of an exemplary embodiment for an MRF method for examination of brains, the values, for example for the parameters T1, T2 and B1 as parameters to be determined, can be chosen as follows: for the parameter T1 to be determined the values for which a comparison signal waveform is to be established can be chosen in such a way that for an overall value range of 10 ms to 4500 ms comparison signal waveforms are established, wherein in a value range section from 10 ms to 90 ms an increment of 10 ms, in a value range section from 100 ms to 1000 ms an increment of 20 ms, in a value range section from 1040 ms to 2000 ms an increment of 40 ms, in a value range section from 2050 ms to 3000 ms an increment of 100 ms, in a value range section from 3100 ms to 4500 ms an increment of 100 ms can be selected. Thus a number $n_{T1}=105$ of different desired values for the parameter T1 is obtained.

For the parameter T2 to be determined the values can be selected in such a way for example that for an overall value range of 2 ms to 3000 ms comparison signal waveforms are established, wherein in a value range section from 2 ms to 98 ms an increment of 2 ms, in a value range section from 100 ms to 150 ms an increment of 5 ms, in a value range section from 160 ms to 300 ms an increment of 10 ms, in a value range section from 350 ms to 800 ms an increment of 50 ms, in a value range section from 900 ms to 1600 ms an increment of 100 ms, in a value range section from 1800 ms to 3000 ms an increment of 200 ms can be selected. Thus a number $n_{T2}=100$ of different desired values for the parameter T2 is obtained.

Using the exclusion rule for example that comparison signal waveforms are only to be established for parameter value combinations of the values of T1 and the values of T2 for which the value of T2 is smaller than the value of T1, the number of combinations of T1 values and T2 values allowed after exclusion can be reduced from 105*100=10500 to 8537.

For the parameter B1 to be determined the values can be chosen in such a way for example that for an overall value range of deviation values from a required value, which corresponds to the value 100%, comparison signal waveforms are established from 60% to 140% wherein the deviation factors are selected in an increment of one percentage point, so that overall $n_{B1}=81$ different desired B1 values corresponding to the deviation factors of 60%; 61%; 62% . . . ; 138%; 139%; 140% are used for the establishing of comparison signal waveforms.

In this way the overall value range sensibly covers the possible values for the parameters T1 and T2 to be determined for substances and tissue expected in a brain and a resolution is chosen in the various value ranges in each case, which can also separate small differences in the relaxation times T1 and T2 in the tissue of a brain more exactly than in known methods. Furthermore long relaxation times, as occur in brain fluids for example, can be covered by the enlarged overall value range and thus likewise be determined with high accuracy.

In particular for relaxation times as parameters to be determined an increment of values to be chosen in value range sections can be chosen with smaller values than in range of value sections with larger values. In this way the resolution of the chosen values for smaller relaxation times is greater than for larger relaxation times, whereby the exponential course of relaxation times can be taken into account.

If the values for which comparison signal waveforms are to be established are chosen at least in one value range section of the overall value range with a constant increment between two adjacent chosen value in the value range, the value of the parameter to be determined in the value range section changes in a linear fashion, i.e. with a constant increment between two selected values. This is of advantage, in particular with (non-iterative) reconstructions of the values of the parameters to be determined be means of independent comparisons for each image point, since the increment and thus the resolution of the values of the parameters to be determined for which comparison signal waveforms are established for a dictionary is only relevant around a most similar comparison signal waveform found by means of the signal comparison and only for the respective image point.

It is also possible to select the values of a parameter to be determined for which comparison signal waveforms are to be established, at least in one value range of the overall value range, in accordance with a logarithmic resolution.

With the dictionary linear in some areas the relative resolution fluctuates drastically within and between the value range sections. By contrast a dictionary discretized on a logarithmic grid creates a constant relative resolution. Thus a logarithmically chosen resolution has the advantage that with a required minimum resolution it is more memory-efficient than a linear resolution. This is of particular advantage with iteratively conducted comparisons for determining the values of the parameters to be determined, in which the values to be determined for the different image points are coupled via a cost function. In this case through this coupling of the results of the parameter values determined of adjacent image points is the increment and thus the resolution of the values of the parameters to be determined, for which comparison signal waveforms have been established for a dictionary is relevant for all most similar comparison signal waveforms of all image points considered determined by means of the signal comparison. Therefore a dictionary used in conjunction with such iteratively conducted comparisons should map all values occurring of the parameters to be determined, in particular all relaxation times occurring with a high resolution, i.e. the values of the parameters to be determined chosen for the establishment of the comparison signal waveforms must be chosen with a high resolution. Instead it can occur that remaining discrepancies of the most similar comparison signal waveforms determined (so-called residuals) thus, through a lack of discretization of the possible values, dominate the value of the cost function used close to the desired optimum and thus falsifies it.

Which resolution is chosen in which value range section can in turn be chosen dependent on desired resolution of the parameter to be determined. For example the resolution in value range sections in which, in accordance with an underlying issue, it is also a matter of a precise determination of smaller differences of a parameter to be determined, can be chosen smaller than the value range sections in which a coarser determination of the parameter to be determined is already sufficient. In this way the resolution of the chosen values of a parameter to be determined can be chosen higher in those areas that are of particular interest for a desired application.

As already mentioned, the recording parameters defining a dictionary in respect of a specific issue, e.g. an examination object to be examined, for example a specific organ of a patient, such as their brain, their heart, the prostate etc. or also a specific diagnostic issue, such as e.g. an oncological or angiographic issue, can be chosen in such a way that, for the respective issue, the effort, in particular in the establishment of the dictionary and/or in the acquisition of associated image time series, is kept as small as possible and/or the parameter values determined by means of the dictionary and the associated image time series are as informative as possible.

It is therefore conceivable that, during loading of the comparison signal waveforms, a choice can be made from a group of at least two different sets of comparison signal waveforms D and D'. Thus different dictionaries can in particular be provided for different issues or also for specific preferences of a user, from which a desired dictionary with the comparison signal waveforms included therein can be chosen, with which an MRF measurement is to be carried out, and for which appropriate image time series can be acquired.

The different sets of comparison signal waveforms, e.g. the different dictionaries, differ here in at least one value from a group of values, which comprises a number of signal measurements SM per comparison signal waveform, a sequence of flip angles used in consecutive measurements for creating an image time series, a sequence of repetition times used in consecutive measurements for creating an image time series, a sequence of echo times used in consecutive measurements for creating an image time series and a sensitivity to at least one parameter to be determined. In other words the different sets of comparison signal waveforms differ in at least one of their underlying recording parameters.

For example a user of an MRF method can be offered a choice of different dictionaries with different characteristics in a manner in which the user can chose a dictionary with the associated comparison signal waveforms suited as well as possible to their procedure. It is also conceivable for the user merely to specify their desired issue or other requirement (e.g. even a maximum measurement time overall) and with the aid of this entry, where necessary taking into account possible hardware prerequisites of the magnetic resonance system used, for a dictionary optimally suited to a request to be chosen automatically, for example using an algorithm, also based on machine learning for example, from the plurality of available dictionaries, with which the MRF method can be carried out.

Figure 2:
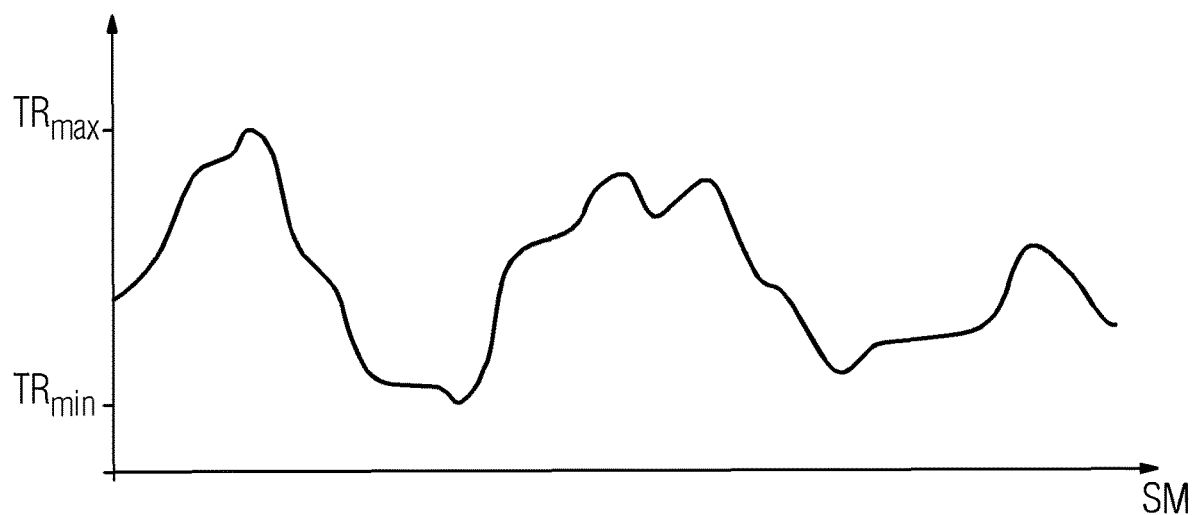
FIG. 2 shows an example of a waveform of repetition times TR to be used as recording parameters for a determination of comparison signal waveforms in consecutive (possibly simulated) signal measurements.

FIG. 2 shows an example of a distribution and the course over the time t for repetition times TR as recording parameters to be applied to consecutive signal measurements SM for a determination possibly carried out by means of a simulation, of comparison signal waveforms (and for acquisition of assigned image point time series). The repetition time used in each case has an influence on the contrast of an MR image reconstructed from measurement data recorded using the repetition time. The variation thus enables different contrasts to be moved through in the comparison signal waveform. The repetition times TR used vary between a minimum repetition time $TR_{min}$ and a maximum repetition time $TR_{max}$. Since the repetition times TR also have an influence on the duration of the measurement, it can be sensible, in order to save time, to choose repetition times TR that are as short as possible, but that should still exhibit a sufficient variation to let the comparison signal waveforms established on the basis of them fluctuate as incoherently as possible over the course of time, i.e. of the signal measurements SM.

Figure 3:
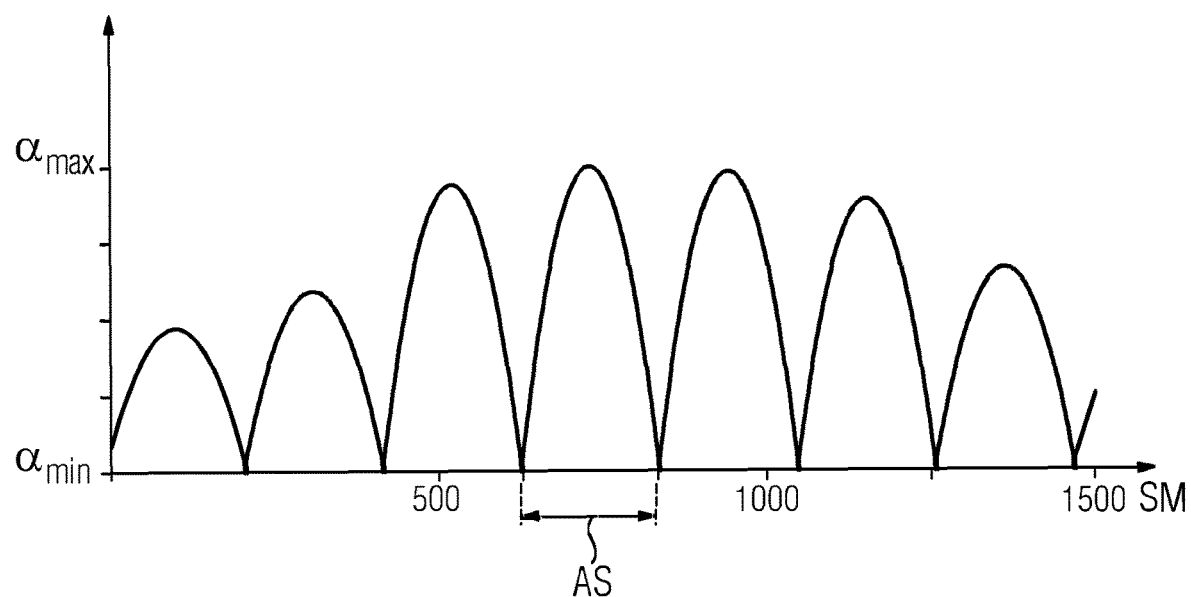
FIG. 3 shows an example of a waveform of flip angles to be used as recording parameters for a determination of comparison signal waveforms in consecutive (possibly simulated) signal measurements.
Figure 4:
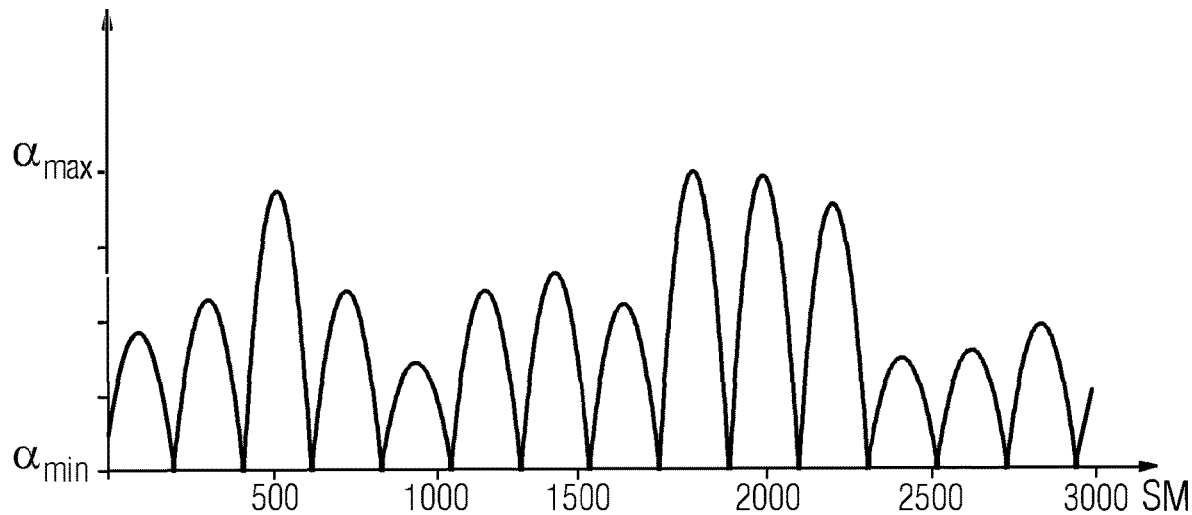
FIG. 4 shows a further example of a waveform of flip angles to be used as recording parameters for a determination of comparison signal waveforms in consecutive (possibly simulated) signal measurements.

By way of example, FIGS. 3 and 4 show examples for a distribution of flip angles as a recording parameter to be applied to consecutive signal measurements SM for a determination possibly carried out by means of a simulation, of comparison signal waveforms (and for acquisition of assigned image point time series). As generally known, the flip angle specifies for each measurement the angle by which the spins located in the examination object are to be flipped by an RF pulse. In other words FIGS. 3 and 4 each show an example of a waveform of the flip angles to be applied for excitation of the spins in an examination object within the framework of an MRF measurement in a number $N_s$ of consecutive signal measurements, and thus the course over the time t of the flip angles during the course of time of the MRF measurement. The number $N_s$ of the individual signal measurements SM comprised by an MRF measurement is greater than five hundred for example, in particular greater than one thousand, for example 1500, as in the example shown in FIG. 3. It can however also comprise several thousand signal measurements SM, e.g. 3000, as in the example shown in FIG. 4, or also more. In this case an increasing number Ns of signal measurements SM comprised by an MRF measurement likewise lets the overall duration of the MRF measurement increase, which is why the number $N_s$ should not be chosen to be too large. On the other hand, as already mentioned, a larger number $N_s$ of individual signal measurements SM and thus a greater length of the waveform created by them, can increase the robustness of the MRF measurement. In particular it is to be expected that with smaller numbers of individual signal measurements SM of an MRF measurement a higher level of noise occurs, which in particular can negatively influence the results of parameters to be determined with fast decay behavior, such as e.g. short relaxation times, such as T2. Thus it was observed for example that MRF methods with less long signal waveforms, i.e. a small number of individual signal measurements SM, in particular for the parameter T2 to be determined, lead to worse results compared with MRF methods with longer signal waveforms.

The examples of waveforms of flip angles to be applied shown in FIGS. 3 and 4 can each only be an extract of an MRF measurement comprising a further signal measurement SM. It is however also conceivable for an MRF measurement to be carried out on the basis of a flip angle distribution shown in FIG. 3 or in FIG. 4, wherein if necessary an inversion pulse can be radiated in as a first RF pulse, as described in the article by Ma et al already mentioned, which is followed by, if necessary a few, e.g. two to five, RF pulses with flip angles of the same size (not shown).

The flip angles shown in FIGS. 3 and 4 lie between a minimum flip angle $\alpha_{min}$, e.g. 0°, i.e. a minimum flip angle that does not cause any deflection of the spin, and a maximum flip angle $\alpha_{max}$, which lies e.g. between 50° and 90°, preferably between 60° and 80°. The maximum flip angle $\alpha_{max}$ can in particular amount to 74°. The larger the maximum flip angle $\alpha_{max}$ chosen, the better shorter relaxation times, such as e.g. T2 can be resolved with signal waveforms created on the basis of the flip angle waveform.

As can be seen in FIGS. 3 and 4, the flip angles shown applied one after another run in a number of consecutive hill-like curves, which divide the flip angle waveform into excitation sections. A hill-like curve of this type can for example have an (only positive) sinusoidal shape. Shown in FIG. 3 is an example of one of the excitation segments explicitly as excitation segment AS. An excitation segment in each case corresponds to the duration of flip angles to be applied one after the other for which flip angle $\alpha \neq 0$ applies, i.e. one hill-type curve in the representation in each case.

At least two of the individual hill-type curves of a common flip angle waveform can each other here in one of the following values: The height of the hill-type curve, i.e. the peak of a hill-type curve, which specifies the maximum flip angle in the excitation segment in each case, and/or in the e.g. average incline of the hill-type curves. It can be predetermined in this case that all excitation elements have a duration that is the same and thus predetermine a number of excitations that is the same.

In the flip angle waveform shown in FIG. 3 the maximum flip angles in the excitation segments shown are on average higher than in the flip angle waveform shown in FIG. 4. In this way, despite the lower number $N_S$ of signal measurements SM in Figure by comparison with that shown in FIG. 4, a similarly good resolution even of short relaxation times, e.g. T2, as parameters to be determined is obtained. The average maximum flip angles of the excitation segments that are selected higher than in the longer flip angle waveform of FIG. 4 compensate at least partly for the shortening of the flip angle waveform. Thus, based on a flip angle waveform as shown in FIG. 3, an MRF method can be carried out that can be carried out in a short time through the small number of signal measurements SM for a signal waveform (half the measurement time compared to the flip angle waveform of FIG. 4 comprising twice as many signal measurements SM), but which at the same time, through the choice of the maximum flip angle in the excitation segments, does not entail any or only entails slight losses in the quality of the parameter values determined.

Figure 5:
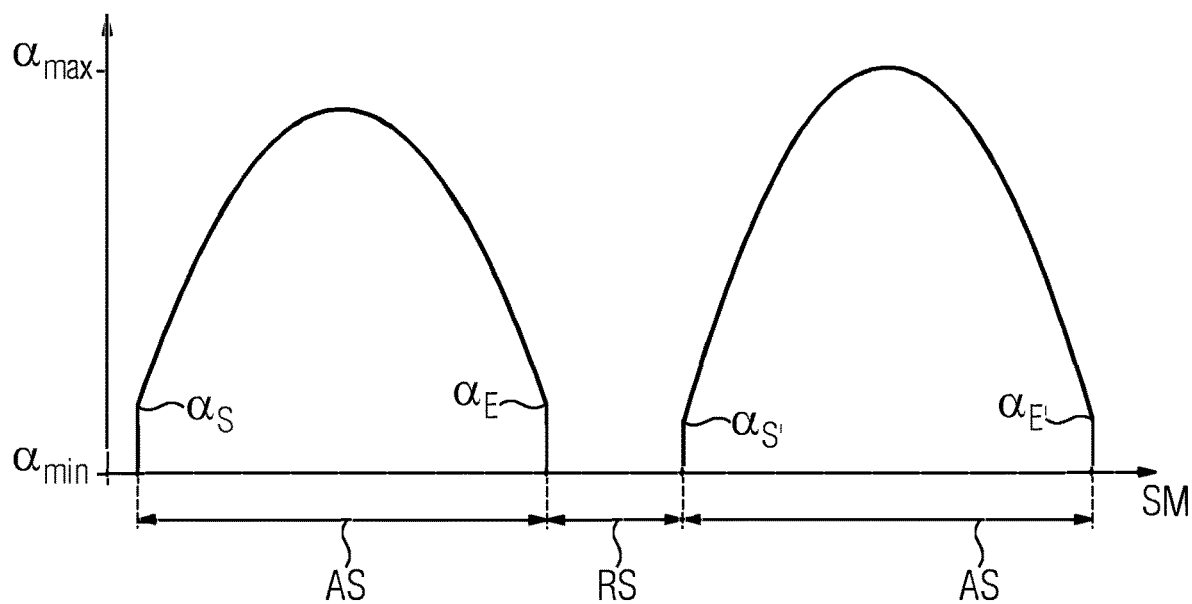
FIG. 5 shows a further example of a waveform of flip angles to be used as recording parameters for a determination of comparison signal waveforms in consecutive (possibly simulated) signal measurements.

Shown in FIG. 5 is a further example of an extract from a distribution of flip angles as recording parameters to be applied in consecutive signal measurements SM for a determination of comparison signal waveforms, if necessary carried out by means of a simulation (and during acquisition of assigned image point time series), in order to describe a few possible details with reference to these.

The curves shown in FIG. 5 also predetermine the recording parameter, to be applied in an establishment of comparison signal waveforms, of flip angles to be applied for a respective signal measurement SM of RF pulses, wherein at least one signal measurement of the comparison signal waveform for the flip angle as recording parameter predetermines the value zero. This is for example the case in the relaxation segment shown in which in a series of at least two consecutive signal measurements of the comparison signal waveform for the flip angle recording parameter, the value zero ($\alpha=0$) is predetermined. In the example shown, inserted between two consecutive recording segments AS is thus a relaxation segment RS, in which no excitation of the spins takes place (since there $\alpha=0=\alpha_{min}$). This thus allows the spins to relax in such a relaxation segment.

A comparison signal waveform can be designed in such a way that relaxation phases are provided in which a magnetization of the spins in the examination object, in particular a longitudinal magnetization of the spins, can relax. To this end, in particular during a relaxation phase for signal measurements of a comparison signal waveform for the flip angle as recording parameter, the value zero can be predetermined.

A relaxation phase of this type can be implemented for example by a relaxation element shown in Figure JDW3.

A relaxation phase, in addition or as an alternative to a predetermination of the flip angle as a zero-value flip angle, can provide for a switching of a destroyer gradient, with said destroyer gradient destroying a magnetization of the spins present in the examination object, in particular a longitudinal magnetization of the spins. A destroyer gradient of this type can in particular be to be switched in the slice direction. Through the use of these types of destroyer gradient the duration of a relaxation phase can be shortened, since the magnetization of the spins will be actively destroyed by said gradient and not decay purely naturally, such as e.g. through the absence of an excitation (i.e. flip angle equal to zero).

Through their influence on the, in particular longitudinal, magnetization of the spins in the examination object, relaxation phases of this type improve the dependence of the comparison signal waveform on relaxation times, in particular T1, and can thus improve the quality of the results of the determination, in particular of the T1 values, by the signal comparison.

Within an excitation segment AS, although the flip angle to be applied in consecutive signal measurements ($\alpha>0$) can basically be freely varied, through changes in the flip angle applied in the consecutive signal measurements that are too great, however, the result can be undesired oscillations of the echo signals created. Therefore it is of advantage to change the flip angles for consecutive signal measurements as softly as possible, whereby for example the hill-type curves shown are produced, which increase the flip angle relatively slowly up to a maximum value and then let it fall again without any large changes.

In order to design the duration of the excitation segment to be as short as possible there can be a deviation from this rule of soft variation, as is shown in the example in FIG. 5 at the beginning and at the end of the excitation segment shown. There the flip angle to be used is raised in a larger change initially to a starting value of $\alpha_S$, $\alpha_{S'}$ of the respective excitation segment and changes back at the end of the respective excitation segment from an end value $\alpha_E$, $\alpha_{E'}$ to the minimum value $\alpha_{min}$. This the time that would otherwise be necessary for a slower increase or decrease of the flip angle. What is more, for very small flip angles, a signal-to-noise ratio (SNR) in the signal created by the excitation is rather small, so that a slightly increased flip angle at the start of an excitation element ensures a better SNR and thereby a better signal. Such a change from $\alpha_{min}$ to a$\alpha_S$ or $\alpha_{S'}$ or from $\alpha_E$ or $\alpha_{E'}$ back to $\alpha_{min}$ can be chosen as amounting to less than 5° for example.

In order to avoid the oscillation effects discussed an actual recording of measurement data of just a few, e.g. two to five signal measurements, can be carried out after such a change in the flip angles to be applied in the consecutive signal measurements or the said few signal measurements after such a change can be not taken into account in a later signal comparison.

As already mentioned a further possible parameter that can be predetermined for the establishment of comparison signal waveforms is the echo time TE, which specifies the time interval between an RF excitation pulse used and the subsequent recording of a signal created therewith, in particular in the case of echo trains, e.g. of a central echo signal in the sampled k-space.

For example, in the article already cited by Ma et al., through the variation of the repetition times TR to be applied in consecutive signal measurements SM and the positioning always chosen as centered of the recording of created echo signals with the repetition time TR, the echo time TE, defined here as the period of time between the excitation of the signal recording and the start of the recording of the echo signal, is also varied.

By contrast with this however a fixed echo time can also be predetermined as a recording parameter for all signal measurements SM, so that a recording of signals within all signal measurements SM of an MRF method occurs at the same point in time after the preceding excitation of the signal measurement. In this way an influence of a T2* decay on the recorded signal can be minimized. With a recording parameter TE chosen as constant the effect of the T2* decay of the spins is primarily a scaling of the overall signal waveform. With varying TE, the effect of the T2* decay, depending on the assigned echo time TE, would be stronger or weaker and not only scale the signal waveform, but thus change the waveform per se. This can be avoided by choosing a constant echo time TE.

In this case the echo time can advantageously be chosen to be as small as possible. The recording of the signals within each signal measurement of an MRF method thus starts at a fixed time at the earliest possible point in time after the associated excitation at the beginning of the repetition time TR interval. By choosing the echo time to be as short as possible the T2 contrast in the recorded signal is increased. The echo time TE here is restricted downwards in particular by recording sequence-specific limitations of the pulse sequence used for recording and/or by limitations of the hardware, in particular of the gradient system, of the magnetic resonance system used.

For the MRF method at least one image point time series BZS of the examination object is acquired (block 109) in such a way that acquired image point time series BZS are comparable with the comparison signal waveforms D or D' able to be established and loaded.

The comparison signal waveforms and the signal waveforms of the acquired image point time series are all the better able to be compared the more similar the conditions are under which the signal waveforms of the comparison signal waveforms on one side and the signal waveforms of the image point time series on the other side have been established or acquired. To this end the acquisition of the image point time series can be done using similar recording parameters, in particular in a similar temporal sequence and similar parameter values of the recording parameters, on the basis of which the comparison signal waveforms D or D' are established. The better the underlying parameters for the comparison signal waveforms established by means of simulation for example correlate with, or even match, the recording parameters actually applied in the acquisition of the image point time series for the signal waveform sections to be compared, the better able to be compared are the (sections of) signal waveforms to be compared of the comparison signal waveforms on the one hand and the image point time series on the other hand. A magnetic resonance system with which an MRF method is to be carried out is therefore controlled where possible in the acquisition of the image point time series in such a way that the recording parameters actually applied in the acquisition of the image point time series actually match the recording parameters used to establish the loaded comparison signal waveforms as well as possible.

An optimization of the acquisition of the desired image point time series to be acquired can be carried out (block 107), wherein an aim of this optimization for example can be a high quality of the measurement data recorded for the acquisition of the image point time series with a measurement time that is as small as possible and a load on the magnetic resonance system to be used that is as low as possible.

Such an optimization can for example comprise a correction of the applied flip angles. There will be further discussion of this below with regard to a use of maps of measurement-specific parameters.

Within the framework of an optimization of the acquisition of the image point time series a waiting time to be adhered to can for example be defined even before the acquisition of the image point time series, in which waiting time spins in the examination object can relax. In this waiting time preferably no RF pulses influencing the examination volume to be examined with the MRF method, e.g. slices, of the examination object, are applied and also where possible no gradient pulses switched that act on the examination object.

The waiting time here can in particular be chosen sufficiently long to let the spins involved in the examination object relax to a sufficient extent. A sufficient relaxation of the spins can already be seen as a prevailing relaxation, wherein for example a degree of a desired relaxation can be used as an underlying basis, e.g. a degree of relaxation of at least 70%, preferably of at least 90%.

The waiting time can be chosen here as a function of relaxation characteristics of the spins present in the examination object. With the aid of the relaxation characteristics the point in time at which a particular degree of relaxation must have been reached can be computed for example.

In order not to extend the measurement time unnecessarily the waiting time can be chosen to be as short as possible. For example a maximum waiting time that may not be exceeded can be defined.

The (maximum) waiting time can for example be set to six seconds for MRF examinations of brains. After six seconds spins in the tissue or substances with short relaxation times are already relaxed and also spins with longer relaxation times, such as for example in brain fluid, are largely relaxed, so that overall a prevailing relaxation of the spins has occurred after this waiting time.

Through such a forced adherence to a predetermined waiting time a high level of robustness of the results of the determination of the parameters to be determined is achieved, even with different MRF measurements.

It is also conceivable here for an initial check to be made as to whether before the start of an acquisition of an image point time series, any excitation of spins in the examination object, or of an excitation relevant to the examination volume involved in the acquisition to be started of an image point time series, has taken place, and for the waiting time only then to be forced when the check determines one of the said cases or estimates the advent of one of the said cases as to be expected. In other words a waiting time of this type can only be provided in such cases in which a magnetization of the spins in an examination volume provided for the acquisition of an image point time series to be started, e.g. by a preceding MR measurement or an MR measurement in an adjacent examination volume, which can also have caused an excitation of spins in the desired examination volume, has already been determined or is at least to be expected. In this way the waiting time is only forced when it is deemed to be necessary, i.e. when a preceding excitation of spins in the examination object could cause a disruption to the intended acquisition of an image point time series.

A further option for an optimization able to be carried out in block 107 is, before the excitation of spins for a recording of measurement data to create an image point time series, to switch neutralization gradients Gn, which neutralize as far possible a magnetization of the spins that may possibly be present in the examination.

Such neutralization gradients Gn can in particular be switched after a recording of measurement data that has already taken place for creating the created image point time series in order to neutralize a residual magnetization caused by this recording. Although the neutralization gradients given here have a similar effect to the destroyer gradients already mentioned above, namely a forced reduction of a magnetization of spins in the examination object, a different name is used here in order to avoid any confusion between the destroyer gradients provided in relaxation phases and the neutralization gradients mentioned here to be switched directly between two consecutive signal measurements for recording of measurement data during the acquisition of the image point time series, and thus the possibly still very different requirements on the destroyer gradients on the one hand and the neutralization gradients on the other hand.

Figure 6:
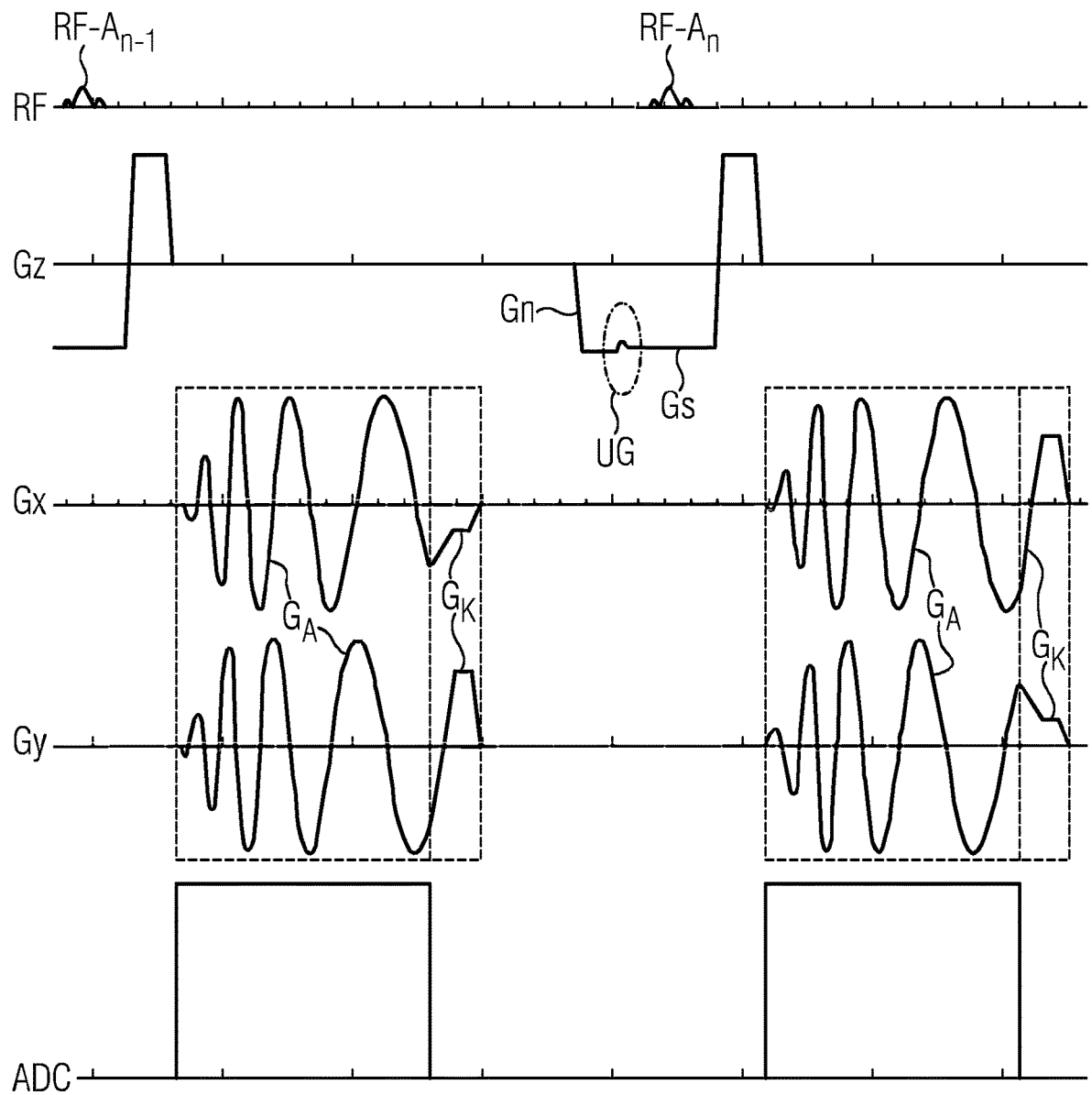
FIG. 6 shows an extract from a schematic of a representation an example of a pulse sequence diagram, which could be employed for recording measurement data within the framework of an acquisition of image point time series.

FIG. 6 shows an extract from a schematic representation of an example of a pulse sequence diagram, which could be used for recording of measurement data within the framework of an acquisition of image point time series. In this case the RF excitation pulses RF-$A_{n-1}$, RF-$A_n$ to be radiated in are plotted in the topmost lines. In the extract depicted two RF excitation pulses RF-$A_{n-1}$ and RF-$A_n$ are shown. The relatively small amplitude of the excitation pulses RF-$A_{n-1}$ and RF-$A_n$ shown is intended to illustrate that the associated flip angles obtained with the RF excitation pulses RF-$A_{n-1}$ and RF-$A_n$ are likewise small.

Depicted in the second line are the gradients Gz to be switched in the slice direction, wherein between the RF excitation pulses RF-$A_{n-1}$ and RF-$A_n$ shown and after a readout block specified in the lowest line ADC, which specifies the duration of a recording of measurement data that was excited by the RF excitation pulse RF-$A_{n-1}$, a neutralization gradient Gn is shown in the drawing.

In a slice-by-slice examination of an examination object, slice selection gradients Gs for selection of a slice to be excited in the examination object can be switched in each case for a recording of measurement data to create image point time series, which, at least for the duration of an associated, simultaneously radiated-in RF excitation pulse RF-$A_{n-1}$, RF-$A_n$ have a plateau, i.e. an amplitude that does not change. A switched neutralization gradient Gn and a switched slice selection gradient Gs are switched here in particular in the same gradient direction.

A slice selection gradient Gs switched during an RF excitation pulse RF-$A_n$ and a neutralization gradient Gn switched at a time before this can preferably be switched in such a way that they merge into each other and thereby overlap. In FIG. 6 the transition UG between a neutralization gradient Gn and the subsequent slice selection gradient GS is marked by a dotted line oval.

By way of an overlap of the neutralization gradient Gn with the subsequent slice selection gradient Gs the duration that the two gradients together require can be reduced. This can be used for a reduction of the measurement time of the overall MRF measurement. For MRF methods in which a large number of signal measurements must be carried out, a reduction of this type of the overall time required for the neutralization gradient Gn and the subsequent slice selection gradient Gs has an especially advantageous effect on the measurement time of the overall MRF measurement, since the effect can be used for each signal measurement. In this case the time that is required for the neutralization gradient Gn can be kept as small as possible.

The waveform of the amplitudes of a neutralization gradient Gn and the subsequent slice selection gradient Gs can be designed in such a way that this waveform, in particular in the transition area UG, where possible has no sudden changes or at least only negligibly small changes. Thus the transition from a neutralization gradient Gn to the subsequent slice selection gradient Gs can be designed to be as smooth as possible. In this way eddy current effects caused by the switched gradients and also noise caused by the switched gradients can be avoided.

The neutralization gradient Gn can also have a plateau. Here the transition between the two plateaus from neutralization gradient Gn to the subsequent slice selection gradient Gs can be designed to be as smooth as possible.

A transition area UG between a neutralization gradient Gn and a subsequent slice selection gradient Gs, in particular a transition between respective plateaus of the two gradients Gn and Gs can be designed here in such a way that the ramp-down down time, which requires a ramping down of a neutralization gradient Gn, in particular from its plateau, is equal to the ramp-down time that the ramping down of the associated slice selection gradient Gs makes use of from an end point of the neutralization gradient, in particular to a plateau of the slice selection gradient Gs.

A further option for an optimization carried out in block 107 is to optimize the readout gradients to be switched for a recording of measurement data within the framework of an acquisition of an image point time series. The readout gradient has a different form, depending on the readout trajectory along which the measurement data is recorded. The readout gradients are switched during the recording of measurement data, i.e. during the readout of signals, for the creation of the image point time series in at least one readout gradient direction and serve to spatially encode the signals read out, and define the readout trajectory along which the measurement data will be sampled in the k-space.

In this case the gradients switched in one readout direction are designed so that their zero moment disappears within a repetition time TR (i.e. the integral of the gradients switched in the readout direction within each repetition time TR must be zero) in order where possible not to have any influence on the magnetization in the following repetition time TR. To this end the gradients switched in one readout direction are constructed as a rule in at least two parts and consist of a first part, the readout gradient, which controls the spatial encoding already mentioned during the recording of the measurement data, and at least one second part, at least one compensation gradient, which ensures that the zero gradient is returned to the value zero in the readout gradient directions involved. To this end a compensation gradient of this type can especially be switched after the end of the reading out of signals, i.e. after a readout gradient in the at least one gradient direction. The switching of the compensation gradient after the readout gradient enables the echo time TE to be kept short, since in the temporal course of the gradients within a repetition time temporal "space" is thus only needed for the compensation gradient after the echo time has expired. In particular compensation gradients can be switched directly after a readout gradient, i.e. directly following on from a readout process.

Compensation gradients can be designed here in each case following on from directly preceding readout gradients in such a way that that a start amplitude of the compensation gradient is equal to the end amplitude of the preceding readout gradient present at the end of a readout process, in particular in such a way that a transition from readout gradient to compensation gradient is designed to be smooth. Here it is clever to design the compensation gradient in such a way that its start amplitude is not equal to zero. In particular the compensation gradient is switched in such a way that it forms a unit with the preceding readout gradient. Such a design of the compensation gradient avoids an otherwise usual ramping down of the readout gradient to the value zero, in order subsequently to start up again from the value zero, and thus saves measurement time.

Compensation gradients here can be switched in such a way that the duration of a compensation gradient and/or the load imposed on the gradient system of a magnetic resonance system used by the compensation gradients is as small as possible.

If the readout gradient used is switched in at least two readout gradient directions, the course of the compensation gradient in one of the readout gradient directions can be designed to be dependent on the course of the compensation gradient in another readout gradient direction. This for example enables a greater freedom to be obtained for the design of a compensation gradient in a readout gradient direction, when the compensation gradient in the other readout gradient direction, in particular with regard to a duration needed for the compensation gradient, dominates, since then the duration predetermined by the dominating compensation gradient in the one readout gradient direction can also be used for the compensation gradient to be switched in the other readout gradient direction, whereby for example gradient increase rates and/or decrease rates (slew rates) can be slowed down, whereby in turn the load on the gradient system is reduced, since unnecessary gradient ramps (slew rates) can be avoided and despite this less steep gradient ramps can be used. Through this noise generated by the gradients to be switched and also a risk of PNS stimulation (muscle spasms) of a patient as examination object can be reduced.

In MRF methods, there is a particularity that the measurement data in accordance with Nyquist does not necessarily completely sample the k-space, but as a general rule can be recorded heavily undersampled, whereby measurement time can be saved. Unacceptable losses for a conventional non-quantitative MR measurement caused by the undersampling (in particular artifacts) in image data reconstructed from undersampled measurement data are less significant within the framework of MRF methods through the large number of signal measurements so that, despite the artifacts contained in the individual image data of a signal measurement of an image point time series in each case, it is possible to determine the parameter values for the image points. To this end, and for further conditions to be considered for this, especially suitable spiral trajectories for a rapid undersampled recording of measurement data will be further discussed below.

Shown in FIG. 6 in the fourth line are the gradients Gx to be switched in the x direction and in the fifth line the gradients Gy to be switched in the y direction. In FIG. 6, by way of example, typical readout gradients switched during a readout process ADC are shown, which ensure that measurement data is recorded along a spiral readout trajectory lying in each case in the x-y plane. The readout gradients $G_A$ here are thus switched in two readout gradient directions, namely in the x direction and the y direction.

To make them easier to recognize, the readout gradients $G_A$ and the compensation gradients $G_K$ are shown by dotted-line boxes.

As can be seen in FIG. 6, the compensation gradients $G_K$ with their preceding readout gradients $G_A$ form one unit, in that the compensation gradients $G_K$ follow on directly from the point at which the preceding readout gradients $G_A$ end.

For readout gradients $G_A$ in particular for (spiral) readout trajectories, which also change for each repetition time TR, a computation of compensation gradients designed in this way is more complicated than the computation of compensation gradients that start from zero. The moments and (end) amplitudes of the readout gradients change, for each repetition time with a readout trajectory rotated differently precisely when spiral readout trajectories that are rotated in the course of the signal measurements are employed.

As can be seen in FIG. 6, the compensation gradients $G_K$ are designed differently according to the different RF excitation pulses RF-$A_{n-1}$ and RF-$A_n$. In the optimization of the compensation gradients $G_K$, the readout gradient direction (gradient axes X and Y) have been considered together, so that e.g. the compensation gradients $G_K$ after the RF excitation pulse RF-$A_{n-1}$ in the x direction (on the Gx axis) could be designed slowed down (running flatter), since after the RF excitation pulse RF-$A_{n-1}$ the compensation gradient Gx in the y direction predetermines the minimum duration of the compensation. By contrast, after the RF excitation pulse RF-$A_{n-1}$, the compensation gradient $G_K$ in the x direction dominates, so that this predetermines the minimum duration of the compensation, and the compensation gradient $G_K$ can fully utilize this duration here in the y direction, and therefore could be designed slowed-down.

A further option for an optimization able to be carried out in block 107 is to optimize the readout trajectories to be used for a recording of measurement data.

In the article by Jiang et al. already cited, spiral readout trajectories are used to record the measurement data for an acquisition of the image point time series. More precisely, 48 spiral readout trajectories each rotated by an increment of 360°/48=7.5° are used that have the characteristic that half of these readout trajectories, i.e. 24, in particular every second trajectory, is sufficient to completely sample the k-space center with these readout trajectories in accordance with Nyquist, and all 48 repetitions using one of the said readout trajectories in each case, in order overall to reach a resolution of 256*256, for which the peripheral k-space area in accordance with Nyquist is completely sampled. A measurement dataset of a repetition from which image data is reconstructed, is thus 48-times undersampled. Therefore the reconstructed image data from which the image point time series to be compared with the database is created can exhibit strong undersampling artifacts. Although Jiang et al. conclude in the article that these undersampling artifacts average each other out overall and therefore should not have an influence on the parameter maps that will be obtained as results of the signal comparison with the database, spatial bias, which is also referred to as shading artifacts, can still occur in the parameter maps.

The parameter values determined by means of MRF methods are based, unlike in conventional reconstruction methods, not directly on recorded measurement data but on signal comparisons with comparison signal waveforms, e.g. comprising a pattern recognition. Therefore it was expected that the results of the determination of the parameter values obtained in this way, if at all, are less susceptible to the artifacts contained in the measured data. The more incoherent is the choice of recording parameters used for the establishment of the comparison signal waveforms and the acquisition of the image point time series, the less strong is the influence of the artifacts contained in individual images recorded and thus in the acquired image point time series on the result of the signal comparison with the comparison signal waveforms. With an incoherence obtained for the recording parameters used and/or the readout trajectories used, on the one hand the ability to distinguish between the signal waveforms of different tissues/substances increases, but on the other hand also the ability to distinguish between the signal waveforms of the acquired image point time series.

The inventors have actually recognized that, in an undersampled recording of measurement data in accordance with Nyquist in each case in a number of repetitions along varied k-space trajectories, the order of the k-space trajectories along which in the consecutive repetitions measurement data is recorded has an influence on the artifacts contained in the measurement data, in particular on undersampling artifacts and deconvolution artifacts contained therein.

These are not solely determined by the degree of the undersampling, but also depend for example on hardware components of the magnetic resonance system used, such as e.g. the gradient power. This is in particular governed by certain device-specific inhomogeneities and required deviations, i.e. deviations from a required value. Through such inhomogeneities and required deviations it is possible for the desired, planned k-space trajectories actually not to be adhered to exactly. Thereby residual moments of the switched gradients can be retained, which can influence the subsequent measurements. These residual moments differ depending on which gradients are switched, e.g. for the readout of the measurement data. Thus different residual moments can remain for different k-space trajectories in each case, which leads to (further) artifacts.

Further reasons why actual measured k-space trajectories can deviate from the planned k-space trajectories and thus why artifacts can occur, are for example uncompensated eddy currents and cross terms remaining that occur due to the switched gradients, inhomogeneities in the B1 field or also errors in the time division of the sequence.

In order to avoid such artifacts, an order of the readout trajectories used for the acquisition of the image point time series, which defines the readout trajectories along which measurement data for an image point time series is recorded in consecutive measurements, can be optimized.

The aim of the optimization here is to define the order in which the readout trajectories are used in consecutive measurements during the acquisition of the image point time series in such a way that artifacts contained in the image data reconstructed from the recorded measurement data actually have as little influence as possible on the results of the determination of the parameter values.

To this end for example an iterative optimization can be used, which minimizes an occurrence of influences of artifacts. It is however also conceivable to compare different orders created previously in order to determine that order which entails the smallest influence on the results of the determination of the parameter values by the artifacts.

In particular with an optimization of this type by comparison it can be of advantage to exclude in advance an order in which the different readout trajectories to be employed in consecutive measurements occur in an order able to be designated as consecutive ascending from a smallest value to a largest value or descending from a largest value to a smallest value (e.g. with regard to an angle of rotation or a shift), since this is already known to be susceptible.

It is conceivable to create these types of different orders for an optimization through comparison by a "sudden" change of a start readout trajectory (e.g. shift or rotation) in order to create an increment that is greater that the smallest possible increment.

In particular with spiral readout trajectories it is of advantage to use a fixed number $N_{tr}$ of variations of the readout trajectory. With such a fixed number $N_{tr}$ of different readout trajectories the readout gradients to be switched for the different readout trajectories in each case are likewise also restricted to the predetermined number $N_{tr}$. Thus the effort for a computation and storage of the waveforms of the necessary readout gradients will be restricted. Thus the compensation gradients also to be determined in each case for the different readout gradients (see above) and where necessary correction terms to be determined in each case for the different readout gradients (e.g. for eddy current compensation) are also restricted to this number $N_{tr}$ of different compensation gradients and/or correction terms, whereby on the one hand the computing power for the computation of these and on the other hand the memory requirement for the storage requested for these is restricted. Such a restriction of the number $N_{tr}$ of the different readout trajectories to be used thus also facilitates the processing of the data needed for the MRF measurement.

For example in a creation of the readout trajectories to be used in consecutive signal measurements by a rotation in each case by the so-called golden angle (~137.5°), the number of readout trajectories produced would turn out to be enormously higher, which leads to difficulties in the computation and processing of the respective associated compensation gradients and the computation and processing of correction terms, in particular for correction of eddy current effects.

The different readout trajectories to be employed in different repetition times, e.g. for spiral readout trajectories, can be obtained by predetermining a start trajectory and choosing the desired number $N_{tr}$ of different readout trajectories, in that the start trajectory is rotated in steps of $360°/N_{tr}$, in order to obtain $N_{tr}$ readout trajectories in all.

The number $N_{tr}$ can in particular be chosen in such a way that, with the $N_{tr}$ readout trajectories of the sampled k space, a desired sampling criterion, for example the fulfillment of the Nyquist criterion in at least one desired area of the sampled k-space, can be sufficiently sampled.

For example the 48 (dual-density) spiral readout trajectories described in the already cited article by Jiang et al. completely sampling the k-space also in the periphery together, which differ from one another by successive rotation by and angle of 360°/48=7.5°), can be arranged in consecutive signal measurements in an order in such a way that readout trajectories used in consecutive signal measurements are rotated in relation to one another in each case by an angle of 82.5° (=11*7.5°). This order corresponds to an increment of 11, i.e. from a consecutive arrangement of the 48 readout trajectories the eleventh next readout trajectory is always used in consecutive signal measurements. For this order an especially small influence of the artifacts contained in the image data of the image point time series was determined.

A further option for an optimization able to be carried out in block 107 is to correct the gradients and/or RF excitation pulses used for the recording of measurement data.

If the measurement data for the acquisition of an image point time series is to be recorded along spiral readout trajectories, readout parameters of the readout trajectory, such as e.g. the plane in which the readout trajectory lies, a field of view (FOV) covered by the readout trajectory, a resolution with which measurement data is to be recorded and/or a density of the coverage in the k-space, can be predetermined by a user.

The fact that the readout parameters can be freely selected also enables for example "angled" slices (not lying exactly in one of the three gradient planes) in the examination object to be examined. Depending on the anatomy to be examined, this is often helpful for having to record fewer slices overall for example to be able to cover a region of interest of the examination object completely.

An example of how a readout gradient can be determined on the basis of such readout parameters, which creates a corresponding readout trajectory, is described in the article by Meyer et al. "Dual-density and Parallel Spiral ASL for Motion Artifact Reduction" Proc. Intl. Soc. Mag. Reson. Med. 19. p. 3986 (2011).

Correction terms can also be determined in each case for readout trajectories largely freely defined by the user, which can be employed if necessary.

A delay correction for correction of delays and/or a delay correction for correction of distortions (caused by eddy currents) comes into consideration for example as a correction method, in particular with regard to gradients to be switched, which correct the readout trajectories actually obtained, so that the actual readout trajectories correspond to desired/planned readout trajectories.

Here, in particular for each readout gradient to be switched for a readout trajectory to be used, a delay correction and/or a distortion correction is established in each case. This enables imperfections of the magnetic resonance system used to be compensated for.

The establishment of a delay correction and/or a distortion correction can comprise a separation into factors to be attributed to inhomogeneities of the applied fields (e.g. B1 and B0) on the one hand and on factors to be attributed to Maxwell factors (concomitant field terms) on the other hand. To this end a B1 map can in particular be loaded and used for the correction (see also further below).

The establishment of correction terms to be used for a delay correction and/or a distortion correction can in particular comprise a determination of a phase to be attributed to inhomogeneities of the applied fields (e.g. B1 and B0) on the one hand and on a phase to be attributed to Maxwell fields (concomitant field terms) on the other hand. Such a procedure is described for examples in the article by Tan et al. "Estimation of k-Space Trajectories in Spiral MR" MRM 61: pp. 1396-1404 (2009) for spiral readout trajectories.

Anisotropic correction terms and eddy current correction terms can be determined separately from one another during the establishment of the correction terms.

In this way the correction terms can be computed in such a way in the k-space that a desired readout trajectory for the acquisition of an image point time series can actually be achieved. Correction terms established for readout trajectories and the associated readout gradients, and where necessary associated RF excitation pulses, can be stored in a memory unit for example and retrieved and applied if required during the acquisition of an image point time series.

In this way a free rotation of the slices is thus possible on the one hand via the selectable readout parameters and FOV and resolution can be set as desired by the user, on the other hand sources of disturbance specific to magnetic resonance systems (delays, eddy currents) can continue to be corrected using the correction terms.

Basically by means of MRF methods, as well as tissue-specific parameters of an examination object being examined, measurement-specific parameters, which e.g. describe the local distribution of the field strengths of the applied magnetic fields, in particular of the basic magnetic field B0, or also the local distribution of the strength of the radio-frequency field B1 radiated in, also referred to as the RF transmit field (and variables derived therefrom such as e.g. a local change of the B1 field or relative local change of the B1 field, e.g. in each case from a required value, also referred to as B1+ or B1*, or absolute B1 values) can be established, since signals recorded by means of MR techniques can depend on tissue-specific parameters present in the examined object as well as on measurement-specific parameters, which do not describe a tissue being examined but the measurement conditions present during the measurement.

To this end the recording parameters used can in their turn be chosen in such a way that the measurement data recorded shows a dependence on the desired parameters to be determined. For example sequence types can be employed for the MRF method that are sensitive to the desired parameters to be determined. Through the dependencies and the variation of the recording parameters and taking them into account in the comparison signal waveforms, the desired parameters are able to be determined from image point time series recorded in this way.

If such measurement-specific parameters are taken in account in the establishment of the comparison signal waveforms, effects, e.g. from inhomogeneities, i.e. local changes or also changes over time, of the measurement-specific parameters taken into account as parameters to be determined in the establishment of the comparison signal waveforms can occur in the signal waveforms, can be assigned to these parameters taken into account and thus the determination of other parameters to be determined can be made dependent on these effects and therefore can be made more precise. If measurement-specific parameters are not taken into account in the establishment of the comparison signal waveforms, which however have an influence on the signal waveform of the signals acquired within the framework of the image point time series, this can lead to falsification of the results of the signal comparison carried out.

Since, as mentioned, however, the number of comparison signal waveforms to be established increases with the number of the parameters to be determined taken into account, it is of advantage only to take into account such measurement-specific parameters as are able to be expected to have an effect mentioned above on the acquired image point time series.

For example in the establishment of the comparison signal waveforms as measurement-specific parameters to be determined, an RF transmit field of the parameters describing the MR system can be taken into account when the signal measurements SM comprised by the MRF method are sensitive to changes of the RF transmit field.

For measurement-specific parameters, which can already be quantitatively determined with conventional MR methods, such as e.g. the local values for the basic magnetic field B0 and the radio-frequency field B1 radiated in, maps of the measurement-specific parameter, e.g. created in such a conventional way, can be employed in order to reduce the effort of a signal comparison between the comparison signal waveforms taking account of the measurement-specific parameter and acquired image point time series.

To this end, before the signal comparison, a map K of a measurement-specific parameter taken into account during the establishment of the comparison signal waveforms, e.g. a B1 map, of the examined examination volume of the examination object can be loaded (block 113). The measurement-specific parameter can thus be a parameter describing the RF transmit field of the magnetic resonance system used, and a B1 map can be loaded.

Such a map K of a measurement-specific parameter taken into account during the establishment of the comparison signal waveforms can also be measured for this for the examination volume to be examined even before the MRF measurement, for example within the framework of a so-called pre-scan, and e.g. stored in a separate file. A map K of the measurement-specific parameter can be determined for example on the basis of image data created from MR measurements of the examination volume, which for example, within the framework of a pre-scan, also makes possible a positioning of the examination object in the magnetic resonance system. Since maps of measurement-specific parameters are also employed in conventional (in particular also non-quantitative) MR measurements e.g. for a wide variety of corrections, it is already usual within the framework of the said pre-scan also to create B0 maps and/or B1 maps (so-called field mapping). Such maps K can be loaded for the method described herein.

A stored map K of a measurement-specific parameter can be taken into account in carrying out signal comparisons between at least two differently acquired image point time series. I.e. a map K of a measurement-specific parameter created once can be re-used for a number of MRF measurements, e.g. with different comparison signal waveforms loaded or also only repetitions of one MRF measurement, and does not have to be created anew, provided the measurement conditions described by the measurement-specific parameters have not changed. Thus it can be sufficient for the map K to be measured once, if necessary e.g. for different desired positions of the examination object, once for each desired position of the examination object in the magnetic resonance system.

The effort to be made for a signal comparison can be reduced by such a loaded map K of a measurement-specific parameter, by e.g. the comparison signal waveforms D used in the signal comparison being restricted on the basis of the map K. To this end for example, on the basis of a value of the measurement-specific parameter established for an image point in the map K, the signal comparison for this image point can be restricted to those comparison signal waveforms that are assigned to a greatest value of the measurement-specific parameter deviating from the cited value of the map K by a predetermined threshold. In particular the signal comparison for an image point can only be carried out with those comparison signal waveforms D that deviate least from the value of the map K (if necessary interpolated to the exact image point). This enables the number of the comparison signal waveforms D to be compared to be significantly reduced. In particular the signal comparison can be reduced by an entire dimension d (the dimension that is spanned by the measurement-specific parameter) when the comparison signal waveforms D used in the signal comparison are restricted by the use of the map K to comparison signal waveforms to which only one value determined by the loaded map K of the measurement-specific parameter is assigned.

A creation of a map K of a measurement-specific parameter of the examination object can also be undertaken manually by a user, in particular if there has not already been provision for a creation of a map K of this type in a pre-scan.

At least one recording parameter used in the measurement of data, on the basis of which a map K of a measurement-specific parameter can be created, can be adapted to the measurement to be carried out on the examination object. In particular the resolution with which the data for the map K is measured and/or the measurement time in which the data for the map is to be measured can be adapted, in order e.g. to ensure a sufficiently high resolution of the map K of the measurement-specific parameter for the MRF measurement carried out (subsequently) and/or to keep the measurement time for the data, on the basis of which a map of a measurement-specific parameter can be created, as short as possible, so as not to adversely affect the efficiency of the MRF measurement and the acceptance of users and patients to be examined. A measurement time for a measurement of data for the creation of a B1 map can amount to 20 seconds for example.

In particular for different positions of the examination object to be measured (by means of desired MRF measurement), a check 115 can be carried out, which determines whether a valid map K of the measurement-specific parameter for the examination object is present at the desired positions to be measured. If a valid map K is already present (decision box 115, y), this can be loaded (block 113). If a valid map K is not yet present (decision box 115, n), such a map K can be created (block 113'). A result of the check can be displayed, so that a user can have the not yet created map K created. It is however also conceivable, in the absence of a valid map K of the measurement-specific parameter for a desired position, for a creation of a map K of the measurement-specific parameter to be carried out automatically at least for the positions of the examination object involved.

It is possible for a loaded map K of the measurement-specific parameter to have a lower resolution than the image points for which the image point time series is acquired. Such a map can be implemented in a short time for the entire desired field of view (FOV). To this end for example the slice thickness of the measurement of the data, on the basis of which the map K is created can be chosen as larger than the slice thickness that is used in the MRF measurement for the acquisition of the image point time series. An example of such an acquisition of parameter maps with a lower resolution is described in the article by Chung et al. "Raid B1+ Mapping Using a Preconditioning RF Pulse with TurboFLASH Readout: MRM 64, pp. 439-446 (2010) using the example of a B1+ map. The use of a pre-scan to create a B1+ map is described for example in the article by Chen et al., "MR Fingerprinting for Rapid Quantitative Abdominal Imaging", Radiology; Vol. 279 (2016).

On the basis of a loaded map K of the measurement-specific parameter, it is possible that values the measurement-specific parameter to be assigned to image points, for which image point time series are acquired, can also be interpolated. For example in the case of a slice position used in the acquisition of the image point time series not precisely matching one in the measurement of the data on the basis of which the loaded map K of the measurement-specific parameter was created, it is possible to load at least one further map of the measurement-specific parameter (not shown) with a further associated slice position that differs from the slice position of the first map K loaded. Then, from the values of the measurement-specific parameter present for a corresponding image point in the said at least two maps, e.g. in accordance with the respective slice position, assuming a linear course of the measurement-specific parameter in the course of the position in the simplest case, the value of the measurement-specific parameter can be interpolated for the corresponding image point of the image point time series.

What is more such a map K, especially a B1 map, can be used to carry out a correction of at least one recording parameter, in particular a correction of a flip angle that is used in the acquisition of image point time series. The flip angle actually achieved in an examination object depends on the actual (local) RF transmit field, which can however be subject to large local fluctuations due to dielectric effects.

What can be achieved by such a correction, in the acquisition of the image point time series, is actually that the desired flip angle also used in the establishment of the comparison signal waveforms is used and not a flip angle that is falsified (by fluctuations in the RF transmit field). As already mentioned the quality of the parameter values determined by the signal comparison can thus be improved, since in this way the recording parameters used in the establishment of the comparison signal waveforms (in particular the flip angle) are as similar as possible to the recording parameters used in the acquisition of the image point time series, whereby the signal waveforms to be compared of the acquired image point time series and the comparison signal waveforms are able to be compared especially well.

Stored and loaded maps of measurement-specific parameters can be subjected to a check that recognizes possibly incorrect image points. The check can comprise a threshold value test for example, which compares the values of the measurement-specific parameter contained in the map with a parameter threshold value, and recognizes image points of the map that have a value that is less than the parameter threshold value to be incorrect. Image points recognized as incorrect can be excluded from further use for example.

To establish similarity values V of the acquired image point time series with the loaded comparison signal waveforms D in each case, at least one signal comparison of at least one section of the respective signal waveform of the acquired image point time series BZS with a corresponding section of the loaded comparison signal waveforms D is carried out (block 111).

When a signal comparison of a signal waveform of an acquired image point time series with a corresponding signal waveform of a comparison signal waveform is carried out, first of all the scope of the data to be compared as part of the signal comparison can be reduced (block 111'), whereby the loaded comparison signal waveforms D are reduced to data-reduced comparison signal waveforms d and acquired image point time series to data-reduced image point time series bzs.

To this end, when a signal comparison of a signal waveform of an acquired image point time series with a corresponding signal waveform of a comparison signal waveform is carried out, signal values of the compared signal waveform can be discriminated, with said (signal values) corresponding to signal measurements during the establishment of the respective comparison signal waveforms, for which (signal measurements) a flip angle having a value of zero is predetermined. In other words if, in an establishment of a comparison signal waveform, the flip angle equal to zero was assigned for at least one signal measurement of the comparison signal waveform, the corresponding signal value of this signal measurement of the comparison signal waveform in the signal waveform of the acquired image point time series can be discriminated in the signal comparison to be carried out. For the comparison signal waveform it is to be expected for signal measurements without excitation (flip angle equal to zero) that these have no signal value, i.e. the signal value equal to zero. In a real recording of measurement data as part of an acquisition of an image point time series however at least a noise signal is always measured, which is to be set to zero here, in order to correspond to the corresponding signal value of the comparison signal waveform. Thereby the stability of the parameter values determined by means of the signal comparison can be increased, even with a low SNR.

A signal value of a signal waveform of an acquired image point time series to be acquired to be compared can be discriminated for example by the signal value of the acquired image point time series being set from a measured value to the value zero. A signal value of a signal waveform of an acquired image point time series to be compared can also be discriminated for example by no signal comparison being carried out for this signal value. In this way signal values can be discriminated by said values being excluded from the signal comparison, which reduces the effort of signal comparison.

In a signal comparison signal values of an acquired image point time series that correspond to a series of consecutive signal measurements, with said signal measurements of the series each having a flip angle with the value zero as assigned recording parameter, can also be discriminated for the signal comparison. For example signal values of an acquired image point time series that correspond to signal values of signal measurements of a relaxation segment RS, as is described in relation to FIG. 5, can be discriminated.

It is also possible to discriminate such signal values as correspond to a series of consecutive signal measurements with a flip angle of zero, i.e. for example to signal measurements of a relaxation segment, only after a decay time corresponding to a predetermined number of signal measurements after a start of a series of consecutive signal measurements with assigned zero-value flip angle. In this way decay effects of the spins can still be taken into account in the signal comparison.

In addition or as an alternative to a discrimination of a signal value of an acquired image point time series, at least one signal value of the acquired image point time series that corresponds to a signal measurement of a loaded, with said signal measurement having as its assigned recording parameter a flip angle with the value zero, cannot be measured as part of the acquisition of the image point time series, i.e. in this case a recording of measurement data for this signal measurement can be dispensed with. Thereby no comparable signal value for the signal measurement of the acquisition of the image point time series corresponding to a signal measurement of a loaded comparison signal waveform with a flip angle equal to zero is present. In this way on the one hand memory requirement can be saved that would otherwise be needed for these signal values (thereby the data volume is reduced), on the other hand a switching of readout gradients to be switched for the readout of measurement data can even be dispensed with. By dispensing with switching of readout gradients the gradient system of the magnetic resonance system used is protected, since less load is thus placed on the gradient system. The readout gradients to be switched for spiral readout trajectories can in particular involve a high load on the gradient system. It is also conceivable, despite dispensing with a recording of measurement data, to continue to switch the readout gradients actually needed for the recording (not carried out). In particular this can serve to avoid departing from a synchronized eddy current state created by the regular switching of the readout gradients, whereby a compensation for the eddy current state (which thus remains the same) is made easier.

In addition or as an alternative in block 111' the extent of the data to be compared within the framework of the signal comparison can be reduced by only real-value portions of the signals of the signal waveforms to be compared being compared, whereby the loaded comparison signal waveforms D are reduced to data-reduced comparison signal waveforms d and acquired image point time series are reduced to data-reduced image point time series bzs.

The image point time series BZS can be acquired for this in such a way that a phase of the respective signals of an image point in the image point time series BZS is known in each case.

It is also possible for the image point time series to be acquired in such a way that a phase difference between the phase of the respective signals of a signal waveform of an image point in the image point time series to be acquired and the phase of at least one other signal of the signal waveform of the image point of the image point time series is known.

It is further conceivable for the image point time series to be acquired in such a way that a phase of the respective signals of an image point in the image point time series is constant in each case. This is the case as a good approximation for example for slowly varying FISP-based MRF methods.

If the known phases or phase differences are taken into account in a signal comparison or if the phase is constant, the signal comparison can be reduced to the real-value portions of the signals with no reductions in quality. The phases or phase differences here can be taken into account for example by a phase correction of the measured signal being carried out on the basis of the known phases or phase differences, which concentrates the main information of the measured signals into the real-value portion, which can be recorded with its own channel. In this way the imaginary value portion (channel) can be ignored in signal comparisons using a convenient approximation (the successful use of "lossy" low-rank techniques in MRF in the time direction assumes that such a "compression" in the phase dimension should be successful).

The image point time series BZS can be acquired using techniques for avoiding oscillations in the real-value signal portions. These types of oscillations could however still lead to losses in the quality of a signal comparison only carried out on the basis a real-value signal portions. By combining with techniques for avoiding these oscillations this risk can be further mitigated.

As techniques for avoiding the oscillations specific conditions can in particular be placed on the recording parameters to be employed. To avoid such oscillations for example the echo times TE to be adhered to in the signal measurements can be set to constant, or specific changes of the flip angles in consecutive measurements (flip angle changes) can be avoided. Here flip angle changes to be avoided can be changes in the absolute flip angle in consecutive measurements by predetermined angles and/or flip angle change speeds. For example in consecutive signal measurements flip angle changes, which exceed a threshold, value (e.g. in degrees) can be to be avoided.

Flip angle change speeds to be avoided, which apply between a preceding signal measurement and the following signal measurement, can be determined here as a function the flip angle used in the preceding signal measurement in the acquisition image point time series. It can be true to say here for example that the smaller a flip angle applied in a signal measurement is, the smaller the flip angle change speed must be that predetermines the flip angle to be applied in the subsequent signal measurement.

Thus a limitation for a permitted speed of flip angle change can especially be smaller, the smaller the flip angle is that is to be changed with the permitted flip angle change speed. Such a limitation can be designed so that it only allows "adiabatic" flip angle change speeds.

This type of limitation to real-value signal portions can enable a factor of 2 in storage efficiency and signal comparison effort to be obtained.

In addition or as an alternative, in block 111' the extent of the data to be compared as part of a signal comparison can be reduced by a compression of the data being undertaken, whereby in their turn the loaded comparison signal waveforms D are reduced to data-reduced comparison signal waveforms d and the acquired image point time series are reduced to data-reduced image point time series bzs.

To this end the signal comparison 111 of at least one section of the respective signal waveform of the acquired image point time series with a corresponding section of loaded comparison signal waveforms D can comprise a singular value decomposition of the signal waveforms to be compared. The similarity value V can be established here on the basis of the singular values established within the framework of the singular value decomposition.

On the basis of the singular value decomposition carried out a main component analysis of the data of the signal waveforms to be compared can further be carried out. The similarity value V can be established here on the basis of the main components established within the framework of the main component analysis.

The data of the signal waveforms to be compared within the framework of the signal comparison can be drastically reduced by only a greatly reduced number of main components established within the framework of the main component analysis compared to the number of signal measurements (corresponding to a number of data points per signal waveform in the time dimension to be compared) being compared with one another. For example waveforms comprising 3000 signal measurements can be reduced to 200 or even just 50, or even fewer main components.

In this way the memory requirement can be significantly reduced (factor 4). What is more the signal comparison can be carried out more quickly on the basis of the reduced data.

It is also conceivable for a threshold value to be determined, which defines how many main components determined in the main component analysis can be discarded after the compression, or to put it another way, to how many of the main components the signal comparison can be reduced. Here for example the energy of the main components determined can be computed and the energy of the main components determined compared with the energy of the first main component. If the ratio of the energy of a tested first component to the energy of the first main component lies below a predetermined threshold, all main components from the tested main component onwards with the ratio below the threshold can be discarded. With a threshold solution of this type the memory requirement can be further minimized for comparable encoding capabilities even of different MRF sequences (or sequence lengths).

A signal comparison 11 can furthermore comprise a sorting out of the comparison signal waveforms D or d (block 111'), whereby the number of comparison signal waveforms D or d to be compared is reduced. In the article already cited by Ma et al. each comparison signal waveform of the dictionary was compared with the acquired image point time series (exhaustive search). This method is time-consuming and can be made faster by exploiting a known structure of comparison signal waveforms included in a dictionary by corresponding sorting out.

For sorting out a signal comparison carried out can comprise a readout technique (pruning technique), which reduces the number of comparison signal waveforms to be compared with the at least one section of the respective signal waveform of the acquired image point time series with a corresponding section to be compared in relation to the total number of loaded signal waveforms. The sorting out is intended to reduce the number of comparison signal waveforms left to be compared, without losing the actual most similar comparison signal waveforms in doing so.

To this end the comparison signal waveforms can be divided into groups with similar characteristics, and a signal comparison initially carried out with a representative of each group in each case. One possibility for achieving this is provided by so-called Fast Group Matching (FGM) methods. The signal comparisons with the representatives enables it to be ensured that groups with the most similar signal comparison waveforms to the signal waveforms for comparison of an acquired image point time series are not discarded without all comparison signal waveforms having to be compared with the signal waveform to be compared. Thus signal comparisons of signal waveforms of the acquired image point time series are only still carried out with comparison signal waveforms that are assigned to a group of which the representative has reached a required minimum similarity value.

Correlation values and/or dependency values, in particular a linear dependence of the comparison signal waveforms on one another can be computed.

The comparison signal waveforms can then be divided up into groups in such a way that the comparison signal waveforms in a group have a higher correlation value and/or dependence value with one another than with comparison signal waveforms that are assigned to another group.

For division into groups the process can be as follows: a first comparison signal waveform is chosen, e.g. at random, and the correlation values and/or dependence values of this first comparison signal waveform are determined. The NG comparison signal waveforms to which the NG largest computed correlation values and/or computed similarity values are assigned, come into a group with the first comparison signal waveform. The process can now be repeated with the remaining comparison signal waveforms until all comparison signal waveforms are assigned to a group. The number NG can be chosen here to correspond to a desired group strength. If for example 9000 comparison signal waveforms are to be equally divided into 450 groups, the group strength amounts to 20. NG would thus be 19 in this example.

The number of different groups is preferably far smaller than the number of the different loaded comparison signal waveforms.

Here the number of groups can be smaller by a factor than the number of the different loaded comparison signal waveforms, wherein the factor lies in a range between a sixteenth and a hundred and fiftieth, preferably between a thirtieth and a hundredth, especially preferably between a fortieth and a sixtieth. The smaller the number of groups is, the fewer signal comparisons have to be carried out overall. It should be noted however that with a decreasing number of groups the probability of accidental discarding of similar comparison signal waveforms increases.

As a first comparison signal waveform, which determines the members of its group, those comparison signal waveforms can also be selected, provided the information needed for this is available, which are assigned parameter values that correspond to parameter values that are to be expected in tissue expected in an examination object.

With a division into groups of this type a comparison signal waveform is only assigned to precisely one group. Other divisions are conceivable, which also allow an assignment to a number of groups, but as a general rule this does not have the same level of efficiency for the sorting out the comparison signal waveforms.

If a similarity is established in a signal comparison of the signal waveform of the acquired image point time series BZS to be compared with a representative of a group that lies below a predetermined similarity threshold, all comparison signal waveforms of this groups are discarded for further signal comparisons. The similarity threshold here can be a relative or an absolute similarity threshold.

A representative of a group can be a comparison signal waveform of the group, but it is also possible to determine the representative of a group from the members of a group, i.e. the comparison signal waveforms assigned to the group. What can be achieved by this is that the representative of a group represents all comparison signal waveforms assigned to the group at least to a certain degree. In particular a representative of a group can reflect an average signal waveform of the comparison signal waveforms of the group. The type of averaging (arithmetic mean, median geometrical average . . . ) selected here can be tailored to what is required.

A further possibility to keep the effort to be made for reconstruction low is to use an approximate nearest neighbor search, in which points in time of measured MRF signal waveforms (i.e. signal waveforms of acquired image point time series) are compared with corresponding points in time of the comparison signal waveforms contained in the dictionary, and a decision is made on the basis of the results of this signal comparison as to which points in time will be next to be compared. This is also possible in a dimension compressed by a reduction to main components for example.

In other words, within the framework of an ANN method, each point in time of a signal waveform considered (in the compressed or time range) is expressed as a separate dimension and tested separately. The value at a predetermined point in time can now be compared with a predetermined threshold value and, depending on the result of this threshold value comparison, another point in time of the signal waveform selected for comparison. In this way a decision tree is executed, which ultimately leads to a group of comparison signal waveforms belonging to this path through the decision tree. Thus only signal comparisons with the comparison signal waveforms found in this way are to be carried out with the signal waveform of the acquired image point time series.

An application of an ANN method is also described, in combination with an iterative reconstruction however, in the article already cited by Cline at al.

This type of approach thus brings about a sorting out in the time dimension (t) of the comparison signal waveforms. For this so-called kd trees can be used, which specify an index for a nearest neighbor search, which divides up the underlying vector space by a recursive creation of hyper-levels in such a way that these intersect coordinates of the vector space at which a maximum variance in the data searched through is present.

A described division into groups, i.e. a sorting out of comparison signal waveforms in a dimension (p) predetermined by the parameters to be determined can also be combined with an ANN method. Here for example, in the comparison signal waveforms left after the sorting out into the dimension p, an ANN search to reduce the data to be compared in the time dimension t can be carried out.

ANN methods are accessible for example via the open source library FLANN (Fast Library for ANN). Although the FLANN library only supports real-value data and not complex-value data as occurs in MR measurements, this can however be compensated for by the complex data being expressed as a double-length real-value vector (since the imaginary portion is considered as a "further" real-value part of the vector). Such an apparent real-value vector is again supported by the FLANN library.

A marked reduction in the signal comparisons to be carried out can also be achieved individually (with any combination) with these methods. The time needed for the signal comparisons to be carried out is also markedly reduced by this.

Within the framework of the signal comparison a similarity value V is determined (block 111'''). The determination of a similarity value V within the framework of a signal comparison of at least one section of the respective signal waveform of the acquired image point time series BZS or bzs with a corresponding section of if necessary sorted-out loaded comparison signal waveforms D or d can comprise a scalar product formation of the signal waveforms to be compared and the scalar product established within the framework of the scalar product formation is determined as the similarity value.

Furthermore there are already ideas that attempt, within the framework of the signal comparison, to use completely different similarity measurements for a determination of a similarity value V, for which the hope is that they can be carried out more quickly. Such a method is described for example in the article by Hoppe E. et al., "Deep Learning for Magnetic Resonance Fingerprinting: A New Approach for Predicting Quantitative Parameter Values from Time Series", Studies in Health Technology and Informatics 243: 2020-206, 2017.

On the basis of the similarity values V established by means of the signal comparisons carried out, the n most similar comparison signal waveforms are established that have the best similarity values V. On the basis of the n most similar comparison signal waveforms the values P of the parameters to be determined are determined (block 117). The number n here is a natural number and can especially be the number one, whereby the most similar comparison signal waveform (the comparison signal waveform with the best similarity value V) is determined, and the value of the parameter to be determined assigned to this most similar comparison signal waveform is determined as the parameter to be determined. It is also conceivable for more than one most similar comparison signal waveform to be determined (n>1). In this case the parameter value P of a parameter to be determined can be determined from parameter values of the parameter to be determined assigned to the n most similar comparison signal waveforms, for example by interpolation.

The determination of the parameter values P of the parameters to be determined can be subjected to a check, e.g. by the determination of the values P of the parameters to be determined comprising a threshold value check (decision box 119).

For this threshold value check 119 different threshold values S for different applications and/or for different parameters to be determined can be defined and be able to be retrieved, e.g. stored in a configuration file (block 121). A threshold value S used for the threshold value checking 119 can be adapted for example by a user of the MRF method, e.g. when a preset threshold value S is felt to be too very restrictive or not selective enough, or when a threshold value S is not yet stored for a specific application.

If the result of the threshold value check 119 for an image point is that at least one of the n best similarity values established for the image point falls below the stored threshold value S (decision box 119, n) the parameter to be determined is assigned an invalidity value as the value P (block 123). It can also be defined that all best similarity values V determined, especially also the best similarity value V, must fall below the threshold value S, so that the invalidity value is assigned. The number to be used for n here of best similarity values established by means of the threshold value check can be stored together with the threshold value S.

The invalidity value allows a user to recognize that no suitable parameter value P of the parameter to be determined could be found. For example the invalidity value determined for an image point can take care of removing the image point from a parameter map constructed from the parameter values P determined for the parameters to be determined. In particular the value zero can be determined as the invalidity value. Such a threshold value check enables value ranges in the parameter maps constructed from the parameter values for the various image points to be removed for which no good match with a comparison signal waveform of the dictionary could be found in the signal comparison carried out. If the most similar similarity value attests to the most similar comparison signal waveform only a weak similarity, it can be assumed that a parameter value assigned to this most similar comparison signal waveform does not represent a permissible result for the determination of the parameters to be determined. This can occur for example in regions of the examination object that have a very low SNR and/or because of a movement of (also for example the flow of fluids within) the examination object, could not be measured constantly in the course of the acquisition of the image point time series etc.

If the result of the threshold value check 119 for an image point is that none of the established n best similarity values for the image point fall below the stored threshold value S (decision box 119, y) a value P of the parameter to be determined is determined for the image point as described above on the basis of the n most similar comparison signal waveforms (block 125).

The values (P) for the respective image point determined in this way, in particular in the form of a said parameter map, can be stored and/or output.

Figure 7:
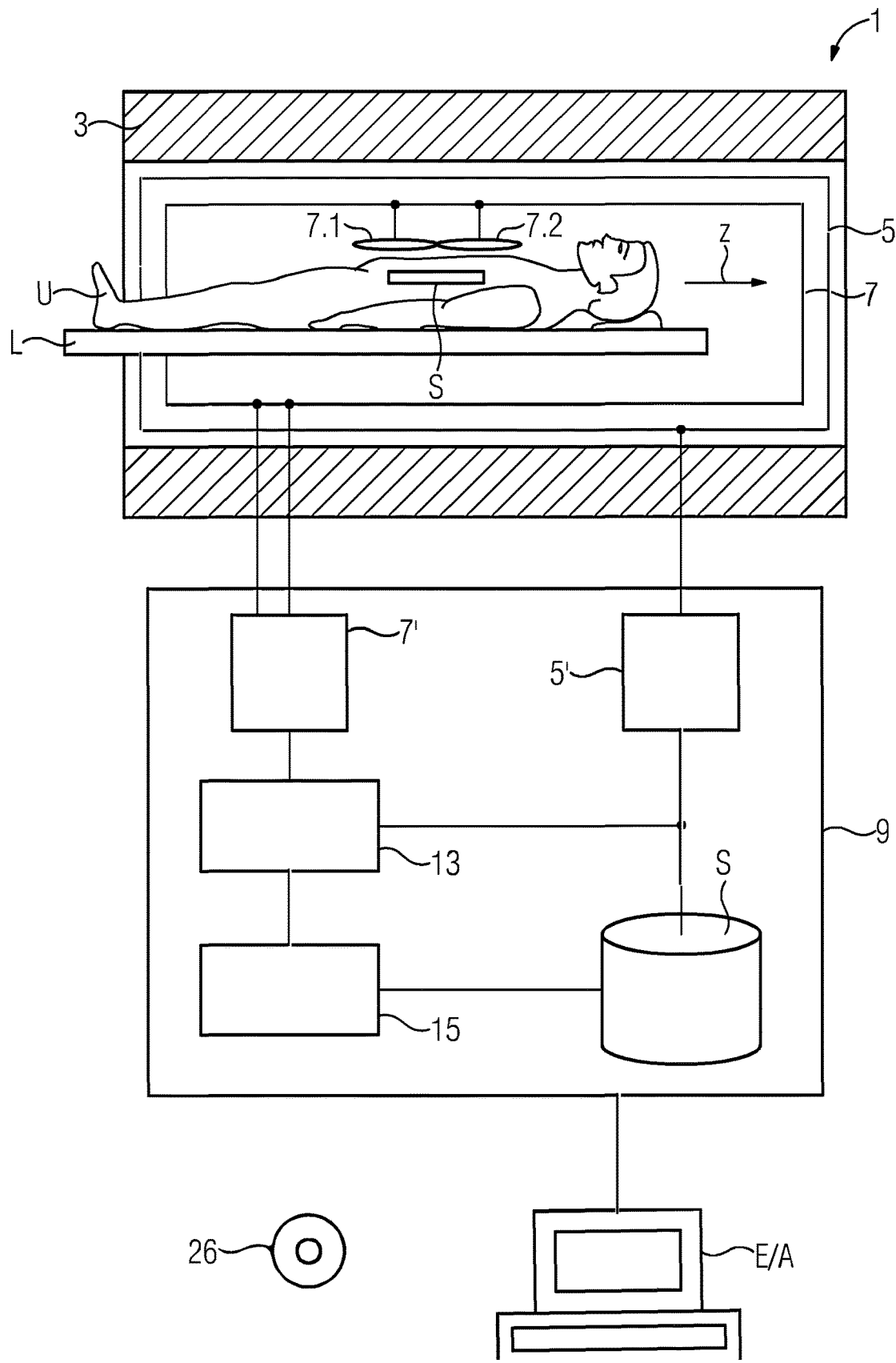
FIG. 7 shows a schematic representation of a disclosed magnetic resonance system.

FIG. 7 shows a schematic of a disclosed magnetic resonance system 1. This comprises a magnet unit 3 for creating a basic magnetic field, a gradient unit 5 for creating the gradient fields, a radio-frequency unit 7 for radiating in and receiving radio-frequency signals and a control facility 9 embodied for carrying out a disclosed method.

In FIG. 7 these subunits of the magnetic resonance system 1 are only shown as rough schematics. In particular the radio-frequency unit 7 can consist of a number of subunits, for example a number of coils like the coils 7.1 and 7.2 shown schematically, which can be designed either only for sending radio-frequency signals or only for receiving triggered radio-frequency signals or for both.

To examine an examination object U, for example a patient or also a phantom, said object can be introduced on a table L onto the magnetic resonance system 1 in its measurement volume. The slice S represents an example of a target volume of the examination object from which the measurement data is to be recorded.

The control facility 9 serves to control the magnetic resonance system and can in particular control the gradient unit 5 by means of a gradient control 5' and the radio-frequency unit 7 by means of a radio-frequency transmit/receive control 7'. The radio-frequency unit 7 can have a number of channels here on which signals can be sent or received.

The radio-frequency unit is responsible, together with its radio-frequency transmit/receive control 7' for the creation and the radiating in (transmission) of a radio-frequency alternating field for manipulation of the spins in a region to be manipulated (for example in slices S to be measured) of the examination object U. In this case the mid frequency of the radio-frequency alternating field, also referred to as the B1 field, is set so that it lies close to the resonant frequency of the spins to be manipulated. Deviations of the mid frequency from the resonant frequency are referred to as off resonance. To create the B1 field controlled currents are applied to the RF coils in the radio-frequency unit 7 by means of the radio-frequency transmit/receive control 7'.

Furthermore the control facility 9 comprises a parameter value determination unit 15 with which in particular signal comparisons for determination of parameter values can be carried out. The control facility 9 is embodied overall to carry out a disclosed method.

A processing unit 13 included in the control facility 9 is embodied to carry out all the computing operations needed for the measurements and determinations needed. Intermediate results and results needed for this or established here can be stored in a memory unit S of the control facility 9. The units shown here are not to be understood absolutely as physically separate units, but merely represent a subdivision into meaningful units, which for example can also be realized in fewer or also in only one single physical unit.

Control commands can be directed, by a user for example, to the magnetic resonance system via an input/output facility E/A of the magnetic resonance system 1 and/or results of the control facility 9, such as image data for example, displayed.

A method described herein can also be available in the form of a computer program product, which comprises a program and implements the method described on a control facility 9 when it is executed on the control facility 9. Likewise an electronically readable data medium 26 with electronically readable control information stored thereon can be available, which comprises at least such a computer program product just described and is embodied in such a way that, when the data medium 26 is used in a control facility 9 of a magnetic resonance system 1, it carries out the method described.

The following examples pertain to further aspects of the disclosure.

Example 1. A method for determining parameter values (P) in image points of an examination volume in an MR system by means of a magnetic resonance fingerprinting (MRF) technique, comprising the steps: Loading of a number N of comparison signal waveforms (D), which are each assigned to predetermined values of the parameters to be determined, wherein the comparison signal waveforms (D) are comparison signal waveforms (D) established using predetermined recording parameters and wherein the recording parameters comprise a number of signal measurements, recording parameters that characterize the RF pulse to be applied for a respective signal measurement (e.g. its flip angle), repetition times that specify the respective time interval between excitations of consecutive signal measurements, Acquisition of at least one image point time series (BZS) of the examination object with the aid of an MRF recording method in such a way that the acquired image point time series (BZS) are able to be compared with the loaded comparison signal waveforms, Carrying out of a signal comparison of at least one section of the respective signal waveform of the acquired one image point time series (BZS) with a corresponding section of loaded comparison signal waveforms (D) to establish similarity values (V) between the acquired image point time series (BZS) and the respective comparison signal waveforms (D), Determination of the values (P) of the parameters to be determined on the basis of the n most similar comparison signal waveforms (d) determined, wherein n is a predetermined natural number, Storage and/or output of the values (P) of the parameters to be determined for the respective image point.

Example 2. The method of example 1, wherein the image point time series is acquired using similar recording parameters to those that were used for establishing the comparison signal waveforms (D).

Example 3. The method of one of the preceding examples, wherein the recording parameters that were used in the establishing of the comparison signal waveforms (D) comprise an echo time during which there is a wait until an excitation before a signal is recorded.

Example 4. The method of one of the preceding examples, wherein the values of at least one of the parameters to be determined are assigned the loaded comparison signal waveforms (D), lie in an overall value range and are selected as a function of values of the respective parameter to be determined of substances assumed to be in the examination volume.

Example 5. The method of example 4, wherein the values selected for the loaded comparison signal waveforms comprise values that are larger and/or smaller than the values of the assumed substances.

Example 6. The method of example 4 or 5, wherein the overall value range is divided into at least two value range sections and in at least two of the value range sections there are values present in a different resolution.

Example 7. The method of example 6, wherein the values are present at least in one value range section of the overall value range as linear values, i.e. with a constant increment between two selected values.

Example 8. The method of example 7, wherein an increment present in value range sections with smaller values is smaller than an increment in value range sections with larger values.

Example 9. The method of one of examples 4 to 6, wherein the values of at least on one value range section of the overall value range are selected in accordance with a logarithmic resolution.

Example 10. The method of one of examples 4 to 9, wherein the resolution of the selected values in value range sections especially relevant for an issue to be examined is higher than in other value range sections of the overall value range.

Example 11. The method of one of examples 4 to 10, wherein at least one value range section of the overall value range with a resolution that is greater than a threshold value is kept as small as possible.

Example 12. The method of one of the preceding examples, wherein during loading of the comparison signal waveforms the selection can be from a group of at least two different sets of comparison signal waveforms.

Example 13. The method of example 12, wherein the different sets of comparison signal waveforms differ in at least one value from a group of values which comprises a number of signal measurements per comparison signal waveform, a waveform of flip angles used in consecutive measurements to create an image point time series, a waveform of repetition times used in consecutive measurements to create an image point time series, a waveform of echo times used in consecutive measurements to create an image point time series and a sensitivity to at least one parameter to be determined.

Example 14. The method of one of the preceding examples, wherein a fixed echo time is predetermined for all signal measurements as the recording parameter.

Example 15. The method of example 14, wherein the echo time is selected as small as possible.

Example 16. The method of one of the preceding examples, wherein, before acquisition of an image point time series, a waiting time is automatically adhered to in which spins in the examination object can relax.

Example 17. The method of example 16, wherein the waiting time is sufficiently long to let spins relax to a sufficient degree.

Example 18. The method of one of examples 16 or 17, wherein the waiting time is selected as a function of relaxation characteristics of the spins present in the examination object.

Example 19. The method of one of examples 16 to 18, wherein the waiting time is selected to be as short as possible.

Example 20. The method of one of the preceding examples, wherein, before an excitation of spins for a recording of measurement data to create the image point time series, neutralization gradients are switched, which neutralize a magnetization of the spins possibly present in the examination object.

Example 21. The method of example 20, wherein a neutralization gradient is switched after a recording of measurement data for creating the created image point time series.

Example 22. The method of one of examples 20 or 21, wherein during an excitation of spins by means of at least one RF excitation pulse for a recording of measurement data to create image point time series, a slice selection gradient for selection of a slice to be excited in the examination object is switched, and the neutralization gradient and the slice selection gradient are switched in a same gradient direction.

Example 23. The method of example 22, wherein the slice selection gradient and the neutralization gradient are switched in such a way that they overlap.

Example 24. The method of one of examples 22 or 23, wherein the waveform of the amplitudes from neutralization gradient to slice selection gradient does not have any sudden changes.

Example 25. The method of one of examples 22 to 24, wherein a ramp down time, which makes use of a ramping down of a neutralization gradient is designed in such a way that it is equal to the (ramp down) time, which makes use of the ramping down of the associated slice selection gradient.

Example 26. The method of one of examples 20 to 25, wherein the time that the neutralization gradient makes use of is as small as possible.

Example 27. The method of one of examples 20 to 26, wherein a transition from a neutralization gradient to a subsequent slice selection gradient is designed to be as smooth as possible.

Example 28. The method of one of the preceding examples, wherein, during the reading out of signals for the creation of the image point time series, readout gradients are switched in at least one readout gradient direction, which are used for spatial encoding of the signals read out.

Example 29. The method of example 28, wherein after the ending of a reading out of the signals, compensation gradients are switched in the at least one readout gradient direction, which lead the zero moment of the readout gradient to the value zero.

Example 30. The method of example 29, wherein the compensation gradients are switched directly after a readout process.

Example 31. The method of one of examples 29 or 30, wherein compensation gradients follow on from the preceding readout gradients in such a way that a start amplitude of the compensation gradient is equal to the end amplitude of the amplitude of the readout gradient present at the end of a readout process.

Example 32. The method of one of examples 30 or 31, wherein a transition between a readout gradient and a subsequent compensation gradient is designed to be as smooth as possible.

Example 33. The method of one of examples 29 to 32, wherein the start amplitude of the compensation gradient is not equal to zero.

Example 34. The method of one of examples 29 to 33, wherein the compensation gradient is switched in such a way that the duration of the compensation gradient is as short as possible.

Example 35. The method of one of examples 29 to 34, wherein the compensation gradient is switched in such a way that the load placed on the gradient system by the compensation gradient is small.

Example 36. The method of one of examples 29 to 35, wherein the readout gradient is switched in at least two readout gradient directions and the waveform of the compensation gradient in one of the readout gradient directions is designed as a function of the waveform of the compensation gradient in another readout gradient direction.

Example 37. The method of one of the preceding examples, wherein an order of the readout trajectories used for the acquisition of the image point time series, which defines the readout trajectory along which measurement data for an image point time series will be recorded in consecutive measurements, is optimized.

Example 38. The method of example 38, wherein the order is defined in such a way that artifacts contained in the image data reconstructed from measurement data recorded within the framework of the acquisition of image point time series have as little influence as possible on the results of determination of the parameter values.

Example 39. The method of one of the preceding examples, wherein the image point time series is acquired using a fixed number of different readout trajectories.

Example 40. The method of one of examples 37 to 39, wherein the different readout trajectories in consecutive signal measurements are not applied in an order able to be designated as consecutive, e.g. in relation to an angle of rotation or a displacement.

Example 41. The method of one of examples 37 to 40, wherein the different readout trajectories can be arranged in a consecutive order, starting from which an order to be applied for consecutive signal measurements is determined by a step-by-step application with a predetermined increment (not equal to one).

Example 42. The method of one of examples 37 to 41, wherein the image point time series is acquired using 48 spiral dual-density readout trajectories, which differ from one another by a successive rotation by 7.5 D in each case, and in consecutive signal measurements the spiral readout trajectories used are each rotated by 82.5 D.

Example 43. The method of one of the preceding examples, wherein the image point time series is acquired using spiral readout trajectories.

Example 44. The method of one of the preceding examples, wherein a fixed number of different readout trajectories for signal measurements are used within the framework of the acquisition of image point time series.

Example 45. The method of one of the preceding examples, wherein a delay correction for correction of delays is applied, which corrects the readout trajectories used.

Example 46. The method of example 45, wherein delay correction terms are established and stored in each case for the gradients to be switched for the readout trajectories.

Example 47. The method of one of the preceding examples, wherein a delay correction is applied for correction of distortions, which corrects the readout trajectories used.

Example 48. The method of example 45, wherein distortion corrections are established and stored in each case for the gradients to be switched for the readout trajectories.

Example 49. The method of one of examples 45 to 48, wherein for establishing corrections, a phase to be traced back to inhomogeneities and to be traced back to Maxwell fields is determined.

Example 50. The method of one of examples 45 to 49, wherein for establishing corrections, anisotropic correction terms and eddy current correction terms are determined separately from one another.

Example 51. The method of one of examples 45 to 50, wherein correction terms are computed in the k.

Example 52. The method of one of examples 45 to 51, wherein correction terms for readout trajectories and the associated readout gradients and if necessary associated RF excitation pulses are computed and stored.

Example 53. The method of one of examples 37 to 52, wherein readout trajectories used can lie in any given plane in the k-space.

Example 54. The method of one of examples 37 to 53, wherein a user of the MRF method predetermines at least one of the readout parameters: field of view, from which the readout is made, resolution of the data read out and plane in which the readout trajectories lie, in particular also for spiral readout trajectories.

Example 55. The method of one of the preceding examples, wherein the recording parameters applied for the establishing of the comparison signal waveforms predetermine flip angles for an RF pulse to be applied to a respective signal measurement, wherein at least one signal measurement of the comparison signal waveform predetermines the value zero for the flip angle as recording parameter.

Example 56. The method of example 55, wherein for a series of at least two consecutive signal measurements of the comparison signal waveform a flip angle with the value zero is predetermined for the recording parameter.

Example 57. The method of one of the preceding examples, wherein in the signal comparison at least one signal value of an acquired image point time series, which corresponds to a signal measurement of a loaded comparison signal waveform, with said signal measurement having as its assigned recording parameter a flip angle with the value zero, is discriminated for the signal comparison.

Example 58. The method of one of the preceding examples, wherein in the signal comparison signal values of an acquired image point time series, which correspond to a series of consecutive signal measurements, with said signal measurements having as their assigned recording parameter a flip angle with the value zero, are discriminated for the signal comparison.

Example 59. The method of one of examples 57 or 58, wherein signal values are only discriminated after a decay time corresponding to a predetermined number of signal measurements after a start of a series of consecutive signal measurements with assigned zero-value flip angle.

Example 60. The method of one of examples 57 to 59, wherein a signal value is discriminated by the signal value being set to the value of zero.

Example 61. The method of one of examples 57 to 60, wherein a signal value is discriminated by no signal comparison being carried out for this signal value.

Example 62. The method of one of the preceding examples, wherein in the acquisition of the image point time series, at least one signal value of an acquired image point time series, which corresponds to a signal measurement of a loaded comparison signal waveform, with said signal measurement having as its assigned recording parameter a flip angle with the value zero, is recorded within the framework of the acquisition of the image point time series.

Example 63. The method of example 62, wherein readout gradients assigned to non-recorded signal values are not switched.

Example 64. The method of one of the preceding examples, wherein a comparison signal waveform provides for relaxation phases in which a magnetization of spins in the examination object, in particular a longitudinal magnetization of spins, can relax.

Example 65. The method of example 64, wherein during a relaxation phase for signal measurements the value zero is predetermined for the flip angle as recording parameter.

Example 66. The method of one of examples 64 or 65, wherein a relaxation phase predetermines a switching of a destroyer gradient, with said destroyer gradient destroying a magnetization of the spins present in the examination object, in particular a longitudinal magnetization of the spins.

Example 67. The method of one of the preceding examples, wherein a signal comparison carried out of at least one section of the respective signal waveform of the acquired image point time series (BZS) with a corresponding section of loaded comparison signal waveforms comprises a singular value decomposition of the signal waveforms to be compared.

Example 68. The method of example 67, wherein the similarity value is established on the basis of the singular values established within the framework of the singular value decomposition.

Example 69. The method of one of the preceding examples, wherein a signal comparison carried out of at least one section of the respective signal waveform of the acquired image point time series (BZS) with a corresponding section of the loaded comparison signal waveforms comprises a main component of the signal waveforms to be compared.

Example 70. The method of example 69, wherein the similarity value is established on the basis of the main components established within the framework of main component analysis.

Example 71. The method of one of the preceding examples, wherein in a signal comparison only real-value portions of the signals of the signal waveforms to be compared are compared.

Example 72. The method of one of the preceding examples, wherein the image point time series is acquired in such a way that a phase of the respective signals of an image point in the image point time series is known.

Example 73. The method of example 72, wherein known phases are taken into account in a signal comparison.

Example 74. The method of one of the preceding examples, wherein the image point time series is acquired in such a way that a phase difference between the phase of the respective signals of a signal waveform to be compared of an image point in the image point time series and the phase of at least one other signal of the signal waveform of the image point of the image point time series is known.

Example 75. The method of example 74, wherein known phase differences are taken into account in the signal comparison.

Example 76. The method of one of the preceding examples, wherein the image point time series is acquired in such a way that a phase of the respective signals of an image point of the image point time series is constant in each case.

Example 77. The method of one of the preceding examples, wherein the image point time series is acquired using techniques for avoiding oscillations in the real-value signal portions.

Example 78. The method of example 77, wherein, as a technique for avoiding oscillations, specific flip angle changes are avoided.

Example 79. The method of example 78, wherein flip angle changes to be avoided can be changes of the flip angles in consecutive measurements by a predetermined angle and/or by flip angle change speeds.

Example 80. The method of example 79, wherein flip angle change speeds to be avoided, which apply between a preceding signal measurement and the signal measurement following it, are determined as a function of the flip angle used in the preceding signal measurement in the establishing of the image point time series.

Example 81. The method of one of examples 79 or 80, wherein a limit for a valid flip angle change speed is smaller the smaller the flip angle is that is to be changed with the flip angle change speed with the limit.

Example 82. The method of one of the preceding examples, wherein a signal comparison carried out comprises a readout technique that reduces the number of the comparison signal waveforms to be compared with the at least one section of the respective signal waveform of the acquired image point time series with a corresponding section in relation to the overall number of the loaded comparison signal waveforms.

Example 83. The method of example 82, wherein the readout technique is a "fast group matching" technique.

Example 84. The method of one of examples 82 or 83, wherein the comparison signal waveforms are divided into groups with similar characteristics, and a signal comparison of a signal waveform of an acquired image point time series is initially carried out in each case with a representative of each group.

Example 85. The method of example 84, wherein if in a signal comparison of the signal waveform to be compared of the acquired image point time series (BZS) with a representative of a group a similarity value that lies below a predetermined similarity threshold is established, all comparison signal waveforms of this group are discarded for further signal comparisons.

Example 86. The method of example 85, wherein the similarity threshold is a relative or an absolute similarity threshold.

Example 87. The method of one of examples 84 to 86, wherein the comparison signal waveforms are divided into groups in such a way that the comparison signal waveforms in one group have a higher correlation value and/or dependency value with one another than with comparison signal waveforms that are assigned to another group.

Example 88. The method of one of examples 84 to 87, wherein a representative of a group reflects an average signal waveform of the comparison signal waveforms of the group.

Example 89. The method of one of examples 84 to 88, wherein a comparison signal waveform is only assigned to precisely one group.

Example 90. The method of one of examples 84 to 89, wherein the number of groups is far smaller than the number of the different comparison signal waveforms loaded.

Example 91. The method of one of examples 84 to 90, wherein the number of groups is smaller by a factor than the number of the different comparison signal waveforms loaded and the factor lies in a range between a sixteenth and a one hundred and fiftieth, preferably between a thirtieth and a hundredth, especially preferably between fortieth and a sixtieth.

Example 92. The method of one of the preceding examples, wherein a determination of a similarity value (V) within the framework of signal comparison of at least one section of the respective waveform of the acquired image point time series (BZS, bzs) with a corresponding section of (where necessary sorted-out) loaded comparison signal waveforms (D, d) comprises a scalar product formation of the signal waveforms to be compared.

Example 93. The method of example 92, wherein the scalar product established within the framework of the scalar product formation is used as the similarity value.

Example 94. The method of one of the preceding examples, wherein in the establishing of the comparison signal waveforms, measurement-specific parameters are taken into account as parameters to be determined.

Example 95. The method of example 94, wherein the establishing of the comparison signal waveforms (D), an RF transmit field (B1; B1*; B1') of the parameters describing the MR system is taken into account as measurement-specific parameter to be determined.

Example 96. The method of one of the preceding examples, wherein a map of a measurement-specific parameter is loaded before the signal comparison.

Example 97. The method of example 96, wherein a B1 map of the examination volume is loaded.

Example 98. The method of one of the preceding examples, wherein for the examination volume to be examined, a map of a measurement-specific parameter taken into account in the establishing of the comparison signal waveforms is measured and stored.

Example 99. The method of one of examples 96 to 98, wherein a stored map of a measurement-specific parameter is taken into account in the carrying out of signal comparisons of at least two different acquired image point time series.

Example 100. The method of one of examples 96 to 99, wherein the loaded map is taken into account by the comparison signal waveforms used for the signal comparison being restricted on the basis of the map.

Example 101. The method of example 98, wherein the map is measured once (if necessary once per position of the examination object in the MR system).

Example 102. The method of example 98 or 101, wherein the recording of a map of a measurement-specific parameter of the examination object is instigated manually by a user.

Example 103. The method of one of examples 98 or 101 or 102, wherein at least one recording parameter of the recording of the map of the measurement-specific parameter is adapted to the measurement to be carried out on the examination object.

Example 104. The method of example 103, wherein the at least one adapted recording parameter of the recording of the map is at least one recording parameter from the group comprising the resolution and the measurement time.

Example 105. The method of one of the preceding examples, wherein for positions of the examination object to be measured within the framework of the MRF method for an acquisition of an image point time series, a check is carried out that determines whether for the examination object at the positions to be measured, a valid map of the measurement-specific parameter is present, and the result of the check is displayed.

Example 106. The method of one of the preceding examples, wherein for positions of the examination object to be measured within the framework of the MRF method for an acquisition of an image point time series, a check is carried out that determines whether a valid map of the measurement-specific parameter is present for the examination object at the positions to be measured, and in the absence of a valid map of the measurement-specific parameter, a map of the measurement-specific parameter is created automatically, at least for positions of the examination object involved.

Example 107. The method of one of examples 96 to 106, wherein the map of the measurement-specific parameter has a lower resolution than the image points that are acquired for the image point time series.

Example 108. The method of one of examples 96 to 107, wherein on the basis of the map of the measurement-specific parameter loaded, image points for which image point time series are acquired are interpolated for values of the measurement-specific parameter to be assigned.

Example 109. The method of one of the preceding examples, wherein a map of a measurement-specific parameter is determined on the basis of image data created from MR measurements of the examination volume.

Example 110. The method of one of examples 94 to 109, wherein the measurement-specific parameter is a parameter describing the RF transmit field of the magnetic resonance system used.

Example 111. The method of one of the preceding examples, wherein the determination of the values (P) of the parameters to be determined for an image point comprises a threshold value check.

Example 112. The method of example 111, wherein for an image point for which at least one of the established n best similarity values falls below a predetermined threshold value, an invalidity value is determined as the value of the parameter (P) to be determined.

Example 113. The method of example 112, wherein the invalidity value is the value zero.

Example 114. The method of one of examples 112 or 113, wherein the threshold value is stored for retrieval in a configuration file.

Example 115. The method of one of examples 112 to 114, wherein the threshold value can be different for different applications.

Example 116. The method of one of examples 112 to 115, wherein the threshold value can be adapted (by a user).

Example 117. A magnetic resonance system (1) comprising a magnet unit (3), a gradient unit (5) a radio-frequency unit (7) and a control facility (9) with a radio-frequency transmit/receive control (7') and a parameter determination unit (15), wherein the control facility (9) is embodied to carry out a method of one of examples 1 to 116 on the magnetic resonance system (1).

Example 118. A computer program, which is able to be loaded directly into a memory of a control facility (9) of a magnetic resonance system (1), with program means for carrying out the steps of the method of one of examples 1 to 116 when the program is executed in the control facility (9) of the magnetic resonance system (1).

Example 119. An electronically readable data medium with electronically readable control information stored thereon, which comprises at least one computer program of example 118 and is embodied in such a way that, when the data medium is used in a control facility (9) of a magnetic resonance system (1), it carries out a method of one of examples 1 to 116.

The invention claimed is:

1. A method for determining parameter values in image points of an examination object in a magnetic resonance (MR) system by a magnetic resonance fingerprinting (MRF) technique, the method comprising:
    loading a number of comparison signal waveforms, which are each assigned to predetermined values of the parameters to be determined, wherein the comparison signal waveforms are established using predetermined recording parameters, and the predetermined recording parameters comprise:
        a number of signal measurements,
        recording parameters that characterize a radio frequency (RF) pulse to be applied for a respective signal measurement, and
        repetition times that specify a respective time interval between excitations of consecutive signal measurements;
    acquiring at least one image point time series of the examination object with the aid of an MRF recording method in such a manner that the acquired image point time series are comparable with the loaded comparison signal waveforms;
    carrying out a signal comparison of at least one section of the respective signal waveform of the acquired one image point time series with a corresponding section of loaded comparison signal waveforms to establish similarity values between the acquired image point time series and the respective comparison signal waveforms;
    determining the values of the parameters to be determined on the basis of the n most similar comparison signal waveforms determined, wherein n is a predetermined natural number; and
    storing and/or outputting the values of the parameters to be determined for the respective image point,
    wherein, during reading out of signals for creation of the image point time series, readout gradients, which are used for spatial encoding of the signals read out, are switched in at least one readout gradient direction, and
    wherein after an ending of the reading out of the signals, compensation gradients, which lead the zero moment of the readout gradient to the value zero, are switched in the at least one readout gradient direction.

2. The method of claim 1, wherein the compensation gradients are switched directly after the reading out of the signals.

3. The method of claim 1, wherein the compensation gradients follow on from preceding readout gradients in such a manner that a start amplitude of the compensation gradient is equal to an end amplitude of the readout gradient present at the end of the reading out of the signals.

4. The method of claim 2, wherein a transition between a readout gradient and a subsequent compensation gradient is designed to be as smooth as possible.

5. The method of claim 3, wherein the start amplitude of the compensation gradient is not equal to zero.

6. The method of claim 1, wherein the compensation gradients are switched in such a manner that a duration of a respective compensation gradient is as short as possible.

7. The method of claim 1, wherein the compensation gradients are switched in such a manner that a load placed on a gradient system by the respective compensation gradients is small.

8. The method of claim 1, wherein the readout gradient is switched in at least two readout gradient directions and the waveform of the compensation gradient in one of the readout gradient directions is designed as a function of the waveform of the compensation gradient in another readout gradient direction.

9. The method of claim 1, wherein the image point time series is acquired using spiral readout trajectories.

10. The method of claim 9, further comprising:
applying a delay correction to correct delays in the readout trajectories.

11. The method of claim 9, further comprising:
applying a delay correction for correction of distortions in the readout trajectories.

12. The method of claim 10, further comprising:
for establishing corrections, determining a phase to be traced back to inhomogeneities and to be traced back to Maxwell fields.

13. The method of claim 10, further comprising:
for establishing corrections, determining anisotropic correction terms and eddy current correction terms separately from one another.

14. The method of claim 10, wherein correction terms are computed in k-space.

15. The method of claim 10, further comprising:
computing and storing correction terms for readout trajectories and the associated readout gradients and/or associated RF excitation pulses.

16. The method of claim 9, wherein readout trajectories used can lie in any given plane in k-space.

17. The method of claim 9, wherein a user of the MRF method predetermines at least one of the readout parameters selected from the group consisting of: field of view, from which the readout is made, resolution of the data read out, and plane in which the spiral readout trajectories lie.

18. The method of claim 1, wherein the recording parameters applied for the establishing of the comparison signal waveforms predetermine flip angles for an RF pulse to be applied to a respective signal measurement, wherein at least one signal measurement of the comparison signal waveform predetermines the value zero for the flip angle as recording parameter.

19. The method of claim 18, wherein for a series of at least two consecutive signal measurements of the comparison signal waveform, a flip angle with the value zero is predetermined for the recording parameter.

20. The method of claim 1, wherein in the signal comparison at least one signal value of an acquired image point time series, which corresponds to a signal measurement of a loaded comparison signal waveform, with said signal measurement having as its assigned recording parameter a flip angle with the value zero, is discriminated for the signal comparison.

21. The method of claim 1, wherein in the signal comparison signal values of an acquired image point time series, which correspond to a series of consecutive signal measurements, with said signal measurements having as their assigned recording parameter a flip angle with the value zero, are discriminated for the signal comparison.

22. The method of claim 20, wherein signal values are only discriminated after a decay time corresponding to a predetermined number of signal measurements after a start of a series of consecutive signal measurements with assigned zero-value flip angle.

23. The method of claim 20, wherein a signal value is discriminated by the signal value being set to the value of zero.

24. The method of claim 20, wherein a signal value is discriminated by no signal comparison being carried out for this signal value.

25. The method of claim 1, wherein in the acquisition of the image point time series, at least one signal value of an acquired image point time series, which corresponds to a signal measurement of a loaded comparison signal waveform, with said signal measurement having as its assigned recording parameter a flip angle with the value zero, is not recorded within the framework of the acquisition of the image point time series.

26. The method of claim 25, wherein readout gradients assigned to non-recorded signal values are not switched.

27. The method of claim 1, wherein a comparison signal waveform provides for relaxation phases in which a longitudinal magnetization of spins in the examination object can relax.

28. The method of claim 27, wherein during a relaxation phase for signal measurements the value zero is predetermined for the flip angle as recording parameter.

29. The method of claim 1, wherein in the establishing of the comparison signal waveforms, measurement-specific parameters are taken into account as parameters to be determined.

30. The method of claim 29, wherein in the establishing of the comparison signal waveforms, an RF transmit field of the parameters describing the MR system is taken into account as a measurement-specific parameter to be determined.

31. The method of claim 1, wherein a map of a measurement-specific parameter is loaded before the signal comparison.

32. The method of claim 31, wherein the loaded map is taken into account by the comparison signal waveforms used for the signal comparison being restricted on the basis of the map.

33. The method of claim 31, wherein at least one recording parameter of the recording of the map of the measurement-specific parameter is adapted to the measurement to be carried out on the examination object.

34. The method of claim 33, wherein the at least one adapted recording parameter of the recording of the map is at least one recording parameter from the group comprising the resolution and the measurement time.

35. The method of claim 1, wherein the determination of the values of the parameters to be determined for an image point comprises a threshold value check.

36. The method of claim 35, wherein for an image point for which at least one of the established n best similarity values falls below a predetermined threshold value, an invalidity value is determined as the value of the parameter to be determined.

37. The method of claim 36, wherein the invalidity value is zero.

38. The method of claim 36, wherein the threshold value is stored for retrieval in a configuration file.

39. The method of claim 36, wherein the threshold value is different for different applications.

40. The method of claim 36, wherein the threshold value is user-adaptable.

41. A magnetic resonance system, comprising:
a magnet apparatus;
a gradient apparatus;
a radio-frequency apparatus; and
a control facility with a radio-frequency transmit/receive controller and a parameter determination apparatus, wherein the control facility is embodied to carry out the method of claim 1 on the magnetic resonance system.

42. A computer program, which is loadable directly into a non-transitory memory of a control facility of a magnetic resonance system, with a program to carry out the method of claim 1 when the program is executed in the control facility of the magnetic resonance system.

43. A non-transitory electronically readable data medium with electronically readable control information stored thereon, which comprises at least one computer program and is embodied in such a manner that, when the data medium is used in a control facility of a magnetic resonance system, the method of claim 1 is executed.

\* \* \* \* \*